United States Patent
Kawaguchi et al.

(10) Patent No.: US 9,385,280 B2
(45) Date of Patent: Jul. 5, 2016

(54) SEMICONDUCTOR LIGHT EMITTING ELEMENT AND METHOD OF MANUFACTURING THE SAME

(71) Applicant: NICHIA CORPORATION, Tokushima (JP)

(72) Inventors: Hirofumi Kawaguchi, Tokushima (JP); Akinori Yoneda, Anan (JP); Hisashi Kasai, Tokushima (JP); Kazuki Kashimoto, Tokushima (JP); Masafumi Itasaka, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/279,890

(22) Filed: May 16, 2014

(65) Prior Publication Data
US 2014/0339587 A1    Nov. 20, 2014

(30) Foreign Application Priority Data

May 17, 2013    (JP) ................... 2013-105270
May 9, 2014    (JP) ................... 2014-097945

(51) Int. Cl.
*H01L 33/00* (2010.01)
*H01L 33/40* (2010.01)
*H01L 33/38* (2010.01)
*H01L 33/36* (2010.01)

(52) U.S. Cl.
CPC .............. *H01L 33/405* (2013.01); *H01L 33/36* (2013.01); *H01L 33/38* (2013.01); *H01L 33/382* (2013.01); *H01L 2933/0016* (2013.01)

(58) Field of Classification Search
CPC ....... H01L 33/36; H01L 33/38; H01L 33/382; H01L 33/385; H01L 33/387; H01L 33/405; H01L 2933/0016
See application file for complete search history.

(56) References Cited

U.S. PATENT DOCUMENTS

2004/0232429 A1* 11/2004 Miki et al. ................. 257/79
2006/0273324 A1* 12/2006 Asai et al. ................. 257/79

(Continued)

FOREIGN PATENT DOCUMENTS

| JP | 2006-245231 A | 9/2006 |
| JP | 2007-080924 A | 3/2007 |

(Continued)

*Primary Examiner* — Su C Kim
(74) *Attorney, Agent, or Firm* — Squire Patton Boggs (US) LLP

(57) ABSTRACT

A semiconductor light emitting element having: a semiconductor laminated body; a full surface electrode containing an Ag provided on an upper surface of the p-type semiconductor layer; a cover electrode that covers a surface of the full surface electrode, is provided to contact on the upper surface of the p-type semiconductor layer at an outer edge of the full surface electrode, and is made of an Al-based metal material; a p-side electrode that is provided on a portion of a surface of the cover electrode; a metal oxide film that covers other surfaces of the cover electrode and contains an oxide of a metal material forming the cover electrode; and an insulation film that is made of an oxide and covers a surface of the metal oxide film, is provided.

20 Claims, 24 Drawing Sheets

(56) References Cited

U.S. PATENT DOCUMENTS

| | | |
|---|---|---|
| 2007/0023777 A1* | 2/2007 | Sonobe et al. ............... 257/103 |
| 2008/0210955 A1 | 9/2008 | Uemura et al. |
| 2011/0233588 A1 | 9/2011 | Deguchi et al. |
| 2012/0273823 A1* | 11/2012 | Yoneda et al. ................ 257/98 |
| 2013/0009195 A1 | 1/2013 | Kawaguchi et al. |
| 2013/0075914 A1 | 3/2013 | Ichihara et al. |
| 2013/0214320 A1 | 8/2013 | Onishi et al. |
| 2013/0277696 A1 | 10/2013 | Matsui et al. |

FOREIGN PATENT DOCUMENTS

| | | |
|---|---|---|
| JP | 2008-186959 A | 8/2008 |
| JP | 2008-300719 A | 12/2008 |
| JP | 2011-204964 A | 10/2011 |
| JP | 2012-138499 A | 7/2012 |
| JP | 2012-238823 A | 12/2012 |
| JP | 2013-84906 A | 5/2013 |
| JP | 2013-171982 A | 9/2013 |
| WO | 2011/105194 A1 | 9/2011 |

* cited by examiner

SEMICONDUCTOR LIGHT EMITTING ELEMENT AND METHOD OF MANUFACTURING THE SAME

CROSS REFERENCE TO RELATED APPLICATION

The present application claims benefit of the filing date of Japanese Patent Application No. 2013-105270 filed on May 17, 2013, and of the filing date of Japanese Patent Application No. 2014-97945 filed on May 9, 2014, the disclosures of which are incorporated herein by reference.

BACKGROUND

1. Field

The invention relates to a semiconductor light emitting element, and a method of manufacturing the semiconductor light emitting element.

2. Description of the Related Art

As one of methods for mounting a semiconductor light emitting element on a mounting substrate, a flip-chip mounting method has been known. The semiconductor light emitting element used for flip-chip mounting has an n-type semiconductor layer and a p-type semiconductor layer formed on a substrate such as sapphire. The semiconductor light emitting element further has an n-side electrode and a p-side electrode which are connected to the n-type semiconductor layer and the p-type semiconductor layer, respectively and are formed on the same plane side of the substrate. After setting the p-type semiconductor layer and the n-type semiconductor layer to face downward, the semiconductor light emitting element is mounted such that the p-side electrode and the n-type electrode are opposed to wiring electrodes on a mounting substrate.

At this time, a light extraction surface of the semiconductor light emitting element is provided on a substrate side which is an opposite side to a surface where the semiconductor layers are laminated. Therefore, a reflection member for reflecting light to the substrate side is provided on a semiconductor layer side.

For example, Patent Literatures, Japanese Patent Publication No. 2007-80924 A, Japanese Patent Publication No. 2006-245231 A or Japanese Patent Publication No. 2012-238823 A disclose semiconductor light emitting elements which are mounted by flip-chip mounting. The semiconductor light emitting element has a sapphire substrate on which the n-type semiconductor layer and the p-type semiconductor layer are laminated in that order. A metal reflection film is formed on an approximately entire upper surface of the p-type semiconductor layer. The metal reflection film is made of an Ag or an Ag alloy and has good reflectivity to, especially, visible light. Also, each semiconductor light emitting element disclosed in these Patent Literatures has a metal film which covers the metal reflection film to prevent Ag migration contained in the metal reflection film, and further has a p-side pad electrode on the metal film.

Further, each semiconductor light emitting element including the metal film disclosed in Japanese Patent Publication No. 2006-245231 A and Japanese Patent Publication No. 2012-238823 A is covered with an insulation film made of an oxide or a nitride except connection portions of pad electrodes with an outside.

The insulation film made of the oxide or the like and the metal film cannot necessarily have a good adhesion property. Problems such that the insulation film is peeled from the metal film and a gap is formed at the connection portions may occur. If the insulation film is peeled from the metal film or the gap is formed, the metal film deteriorates under moisture, oxygen and the like in an open air. Consequently, if a prevention function to Ag migration of the metal film lowers, Ag migrates and a function as the semiconductor light emitting element is damaged.

Further, the metal film which prevents the migration is formed in consideration of a barrier property to Ag and an adhesion property with the reflection film. For example, each semiconductor light emitting element disclosed in Japanese Patent Publication No. 2006-245231 A and Japanese Patent Publication No. 2012-238823 A has a bottom layer made of Ni, Pt, Ti in the metal film for preventing migration abutting on the reflection film. However, since reflectance to, especially, the visible light of these metals is relatively low, light cannot be reflected sufficiently on a surface where the metal film abuts on the semiconductor layer at an outer edge of the reflection film, and light extraction efficiency suffers due to the low reflectance.

SUMMARY

The invention is to provide a semiconductor light emitting element having a reflection film which contains Ag and a metal film which prevents migration of Ag contained in the reflection film, which maintains good prevention effect to migration and improves the light extraction efficiency, and a method of manufacturing the semiconductor light emitting element.

A semiconductor light emitting element has: a semiconductor laminated body in which an n-type semiconductor layer and a p-type semiconductor layer are laminated; a first metal film that is provided on an upper surface of the p-type semiconductor layer and of which a surface contacting on the p-type semiconductor layer is made of an Ag or an Ag-based alloy; a second metal film that covers a surface of the first metal film, is provided to contact on the upper surface of the p-type semiconductor layer at an outer edge of the first metal film, and is made of an Al or an Al-based alloy; a third metal film that is provided on a portion of a surface of the second metal film; a metal oxide film that covers other portions of the second metal film and contains at least an oxide of a metal material forming the second metal film; and an insulation film that covers a surface of the metal oxide film and is made of an oxide.

Further, a method of manufacturing a semiconductor light emitting element has steps of: forming a semiconductor laminated body by laminating a n-type semiconductor layer and a p-type semiconductor layer; forming a first metal film on an upper surface of the p-type semiconductor layer such that a surface contacting on the p-type semiconductor layer is made of an Ag or an Ag-based alloy; forming a second metal film that covers a surface of the first metal film, is provided to contact on the upper surface of the p-type semiconductor layer at an outer edge of the first metal film, and is made of an Al or an Al alloy; forming a metal oxide film that covers a surface of the second metal film and contains at least an oxide of a metal material forming the second metal film; forming an insulation film that covers a surface of the metal oxide film with an insulation material made of an oxide; and exposing a portion of the surface of the second metal film by etching; and forming a third metal film on an exposed portion of the second metal film.

DETAILED DESCRIPTION OF THE PREFERRED EMBODIMENTS

Figure 1A:
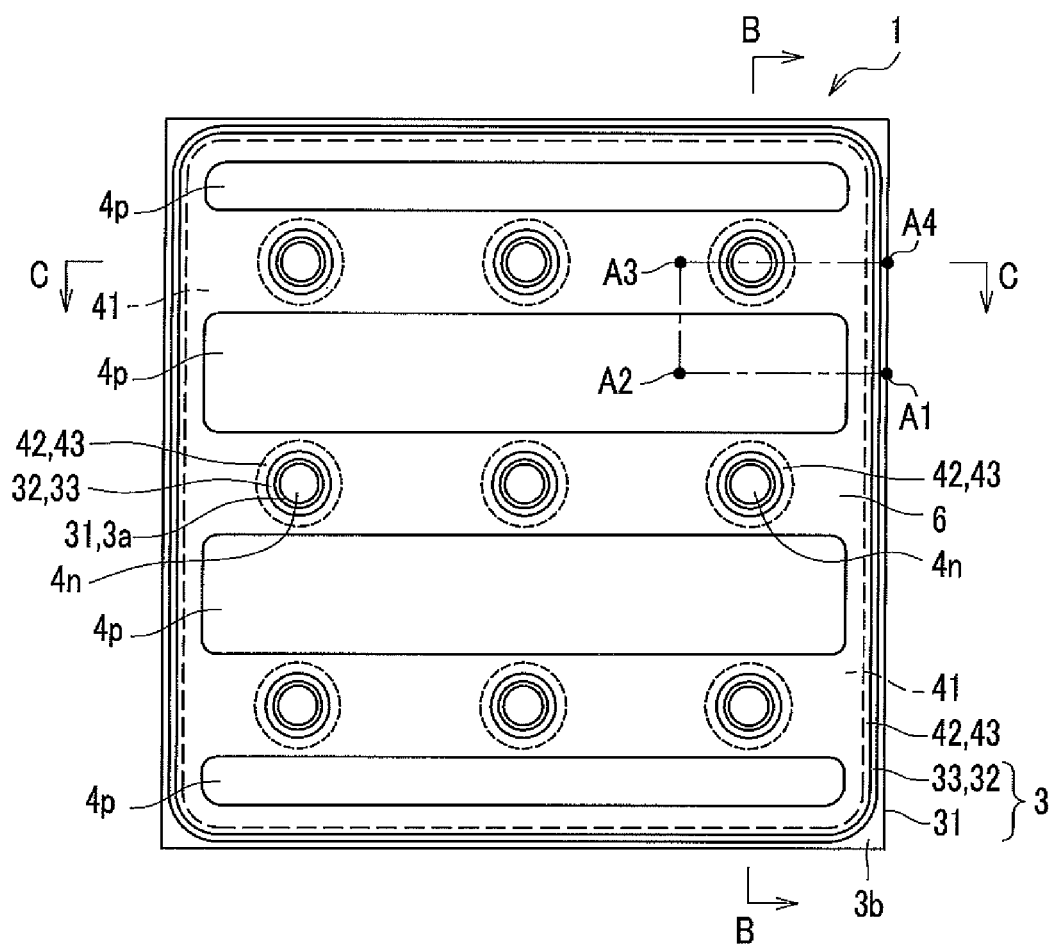
FIG. 1A is a schematic planar view illustrating a structure of a semiconductor light emitting element according to a first embodiment.
Figure 1B:
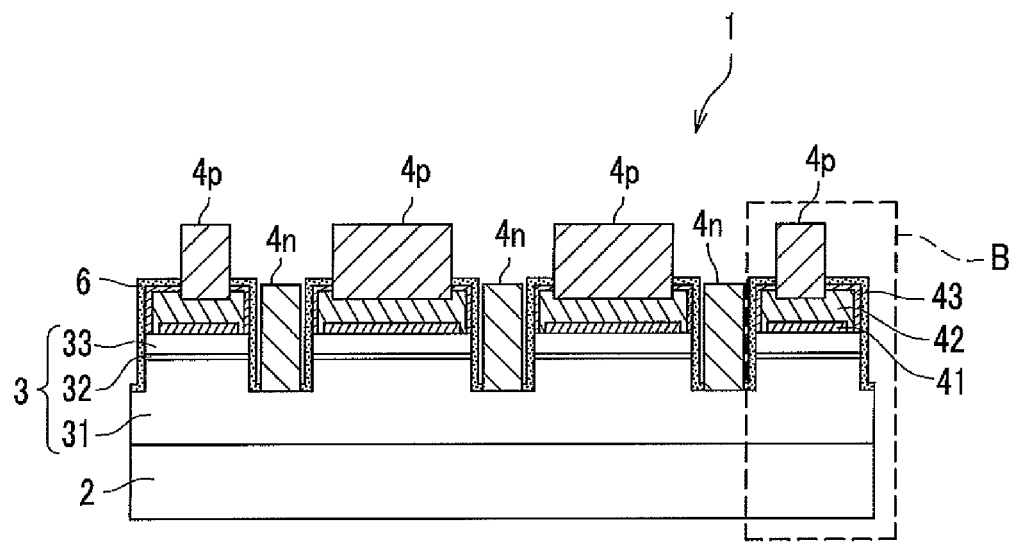
FIG. 1B is a cross-sectional view along line B-B in FIG. 1A.
Figure 1C:
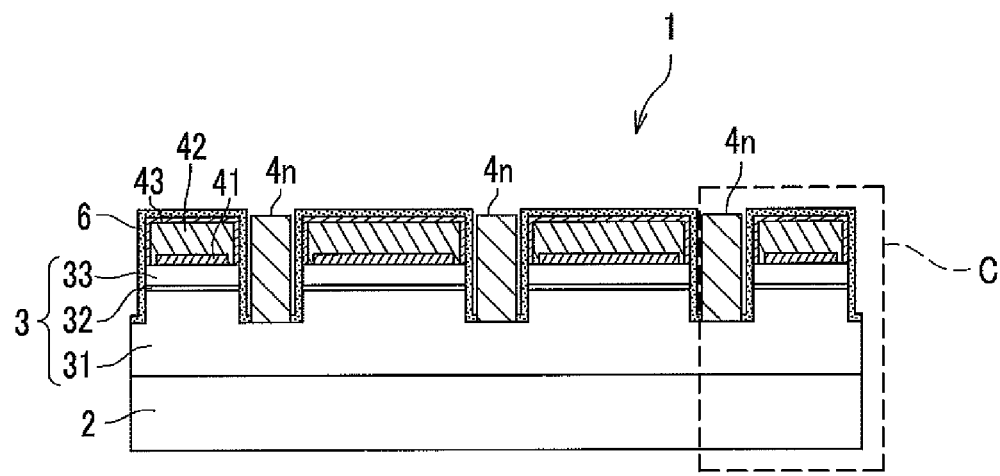
FIG. 1C is a cross-sectional view along line C-C in FIG. 1A.
Figure 1D:
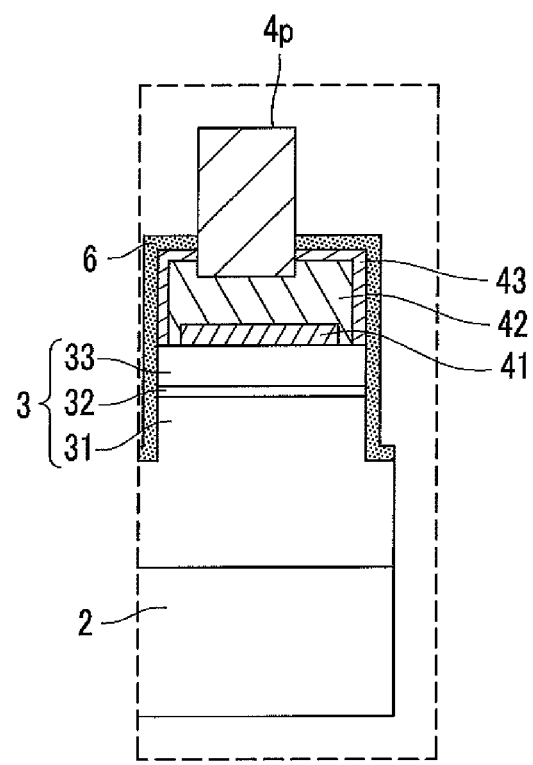
FIG. 1D is a detail view of box B of FIG. 1B.
Figure 1E:
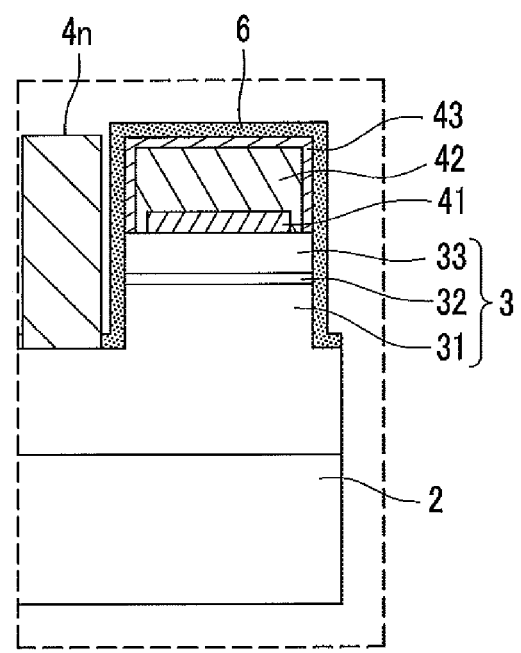
FIG. 1E is a detail view of box C of FIG. 1C.

Hereinafter, a semiconductor light emitting element and a method of manufacturing the semiconductor light emitting element according to embodiments will be explained with reference to accompanying drawings.

In the explanations below, since the drawings illustrate the embodiment schematically, a scale, spaces and positional relationships of each member, etc. may be exaggerated and portions of members may not be illustrated. Further, the scale and the spaces of each member may not correspond between planar views and cross-sectional views. Still further, in the explanations below, same or similar members are basically denoted by the same names and reference numbers, and detailed descriptions thereof will be omitted.

<First Embodiment>

[Structure of a Semiconductor Light Emitting Element]

A structure of a semiconductor light emitting element according to a first embodiment will be explained with reference to FIGS. 1A to 1F. It is noted that FIG. 1F is a cross-sectional view along point A1-point A2-point A3-point A4 in FIG. 1A. FIG. 1F illustrates widths of members and spaces therebetween by scaling as needed to make an internal structure of the semiconductor light emitting element clearer. The points A1 to A4 illustrated in FIG. 1F correspond to points A1 to A4 in FIG. 1A, respectively. A semiconductor light emitting element 1 according to the first embodiment is an LED (Light Emitting Diode) for flip-chip mounting. As illustrated in FIGS. 1B to 1F, the semiconductor light emitting element 1 according to the first embodiment has a substrate 2, a semiconductor laminated body 3 laminated on the substrate 2, an n-side electrode 4n, a full surface electrode 41 (first metal film), a cover electrode 42 (second metal film), a metal oxide film 43, a p-side electrode 4p (third metal film) and an insulation film 6. In the embodiment, to fit for flip-chip mounting, both the n-side electrode 4n and the p-side electrode 4p are provided on a surface of the substrate 2 where the semiconductor laminated body 3 is provided.

Figure 1F:
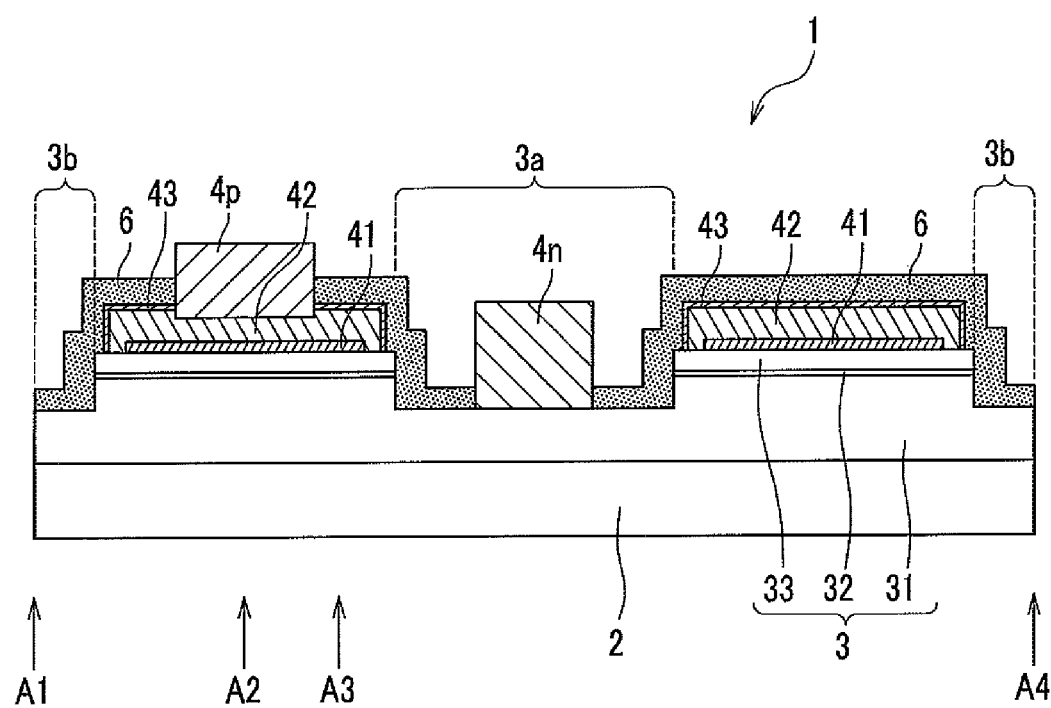
FIG. 1F is a cross sectional view along point A1-point A2-point A3-point A4 in FIG. 1A.

In FIG. 1A, the insulation film 6 and the metal oxide film 43 are not illustrated. Further, in a cross-sectional view of FIG. 1B, each layer of the substrate 2 and the semiconductor laminated body 3 is not illustrated by hatching.

In the specification, "upper" indicates a direction which is perpendicular to a surface of the substrate 2 where the semiconductor laminated body 3 is laminated and along which the semiconductor laminated body 3 is laminated. For example, in FIGS. 1B to 1F, the "upper" indicates an upper direction in the figure.

(Substrate)

The substrate 2 may be made of any substrate materials on which the semiconductor laminated body 3 can carryout epitaxial growth, and a size, thickness etc. thereof are not particularly limited. In case that the semiconductor laminated body 3 is made of a nitride semiconductor, an insulating material such as sapphire or spinel ($MgAl_2O_4$) having either a C-plane, an R-plane or an A-plane as principal plane may be used. Further, silicon carbide (SiC), silicon, ZnO, ZnS, GaAs, diamond may be used. Still further, oxide such as lithium niobate or neodymium gallate which are capable of forming a lattice matching with a nitride semiconductor may be used. Further, since the semiconductor light emitting element 1 of the first embodiment is directed to flip-chip mounting, a light extraction surface is provided on a reverse surface of the substrate 2. Therefore, since light emitted in the semiconductor light emitting element 1 emits from the light extraction surface through the substrate 2, the substrate 2 is preferably transparent to at least wavelength of the light.

(Semiconductor Laminated Body)

The semiconductor laminated body 3 has an n-type semiconductor layer 31, an active layer 32, and a p-type semiconductor layer 33 in a laminated structure from the substrate 2 side successively. Further, in the first embodiment, stepped portions 3a, 3b are provided which are formed by removing all of the p-type semiconductor layer 33 and the active layer 32 and a portion of the n-type semiconductor layer 31 in a thickness direction at a portion of a surface of the semiconductor laminated body 3.

The stepped portion 3a is a region for providing the n-side electrode 4n. In the first embodiment, as illustrated in FIG. 1A, the stepped portion 3a has an approximately circular shape seen in planar view. Shortly, cylindrically concaved portions are provided at nine positions on the semiconductor laminated body 3 as stepped portions 3a. Further, the stepped portion 3b is formed at an outer edge portion of the semiconductor laminated body 3, and is a remainder of a cutting region for forming the semiconductor light emitting element 1 as a chip structure from a wafer in a manufacturing process.

The number, a shape and arrangement positions of the stepped portions 3a are not limited to this embodiment and the stepped portion 3a may be provided at one or more positions with an appropriate shape in an appropriate region.

Though the n-type semiconductor layer 31, the active layer 32 and the p-type semiconductor layer 33 are not especially limited, in case of the nitride semiconductor, a semiconductor material such as $In_XAl_YGa_{1-X-Y}N$ ($0 \leq X$, $0 \leq Y$, $X+Y \leq 1$) may be used, and a gallium nitride based compound semiconductor is preferably used. Each of the n-type semiconductor layer 31, the active layer 32 and the p-type semiconductor layer 33 may have a single layer structure, or may have a laminated structure or a superlattice structure of layers having different compositions and film thickness. Especially, the active layer 32 as light emitting layer preferably has a single quantum well structure or a multiple quantum well structure in which thin films producing a quantum effect are laminated. Further, the well layer is preferably a nitride semiconductor containing In. The n-type semiconductor layer 31 may be formed on the substrate 2 via a ground layer (not illustrated) such as a buffer layer for properly buffering inconsistency of a lattice constant with the substrate 2.

In the first embodiment, though a forming method of the semiconductor layer is not particularly limited, a MOVPE (Metal-Organic Vapor Phase Epitaxy), a MOCVD (Metal Organic Chemical Vapor Deposition), a HVPE (Hydride Vapor Phase Epitaxy), a MBE (Molecular Beam Epitaxy) or the like can be preferably used, which are well-known as growth methods of a nitride semiconductor. Particularly, the MOCVD is preferable because of growth with excellent crystallizability. Further, preferably, a growth method may be appropriately selected from various growth methods for the semiconductor laminated body 3 based on intended use for each layer.

(Full Surface Electrode (First Metal Film))

The full surface electrode 41 is an electrode which is provided on the p-type semiconductor layer 33 to cover almost all surface of the p-type semiconductor layer 33, and which evenly diffuses electric current supplied from an outside via the p-side electrode 4p and the cover electrode 42 over an entire surface of the p-type semiconductor layer 33. Further, the semiconductor light emitting element 1 according to the first embodiment for flip-chip mounting has a function as reflection film for reflecting the light emitted in the active layer 32 toward the reverse surface side as light extraction surface of the substrate 2.

The full surface electrode 41 is preferably an ohmic electrode which can be electrically connected to the p-type semiconductor layer 33 properly and preferably has high reflectance to wavelength of the light emitted at least in the active layer 32. Therefore, in the first embodiment, a single layer film of an Ag or an Ag-based alloy having high light reflectance and a multilayer film with Ni, Ti or the like having the Ag or the Ag-based alloy as a bottom layer can be used suitably for the full surface electrode 41. More preferably, a multilayer film of Ag/Ni/Ti/Ru having Ag as the bottom layer (p-type semiconductor layer 33 side) can be used. The full surface electrode 41 can be formed to laminate these materials sequentially by a sputtering method, an evaporation method or the like.

Though film thickness of the full surface electrode 41 is not particularly limited, for example, in case that a single layer film of the Ag or the Ag-based alloy is formed, the film thickness can be set to a value such that the light from the active layer 32 can be reflected effectively, the value being especially around 20 to 1000 nm, preferably around 50 to 300 nm, and more preferably around 100 nm. In case of the multilayer film as the full surface electrode 41, total film thickness is around 50 to 5000 nm and is preferably around 50 to 1000 nm. The film thickness of the Ag or the Ag alloy film contained in the multilayer film can be adjusted appropriately within such a range. Further, in case of the multilayer film as the full surface electrode 41, the Ag or the Ag alloy film and a film laminated thereon may have the same shape by patterning in the same process, and the Ag or the Ag alloy film at the bottom layer is preferably covered with a film (preferably, a metal film such as Ni or Ti which does not react with Ag) laminated thereon. Thus, whatever electrode material is used as a portion of the full surface electrode 41 on the metal film which does not react with Ag, the material does not contact with the Ag or the Ag-based alloy film directly. Therefore, reaction with Ag can be prevented.

(Cover Electrode (Second Metal Film))

The cover electrode 42 is a metal film which covers an entire surface of the full surface electrode 41, that is, an entire upper surface and an entire full side surface, and functions as barrier layer for preventing migration of a constituent material of the full surface electrode 41, especially Ag.

Further, the cover electrode 42 contacts on an upper surface of the p-type semiconductor layer 33 at an outer edge portion of the full surface electrode 41 and functions as reflecting film on a contact surface with the p-type semiconductor layer 33.

Current density rises in the semiconductor laminated body 3 around the n-side electrode 4n. Thus, emission intensity rises in a region of the active layer 32 facing the n-side electrode 4n seen in planar view. Therefore, in the region having high emission intensity, light extraction efficiency can be improved by raising reflectance of the cover electrode 42 which contacts with the p-type semiconductor layer 33 laminated on the active layer 32.

Thus, a material is preferably used for the cover electrode 42, which can prevent migration of Ag in the full surface electrode 41 properly and has high reflectance to the wavelength of the light emitted from the active layer 32. An Al or an Al-based alloy can be used as such a material. As an Al-based alloy, for example, an Al—Cu alloy (for example, Cu: 2 mass %, Al: remainder), an Al—Cu—Si alloy (for example, Cu: 2 mass %, Si: 1 mass %, Al: remainder) can be used. Additive amount such as Cu, Si can be properly prepared, and around 0.1 to 10 mass % of Cu and around 0.1 to 10 mass % of Si can be contained. Further, the film thickness of the cover electrode 42 can be set around 100 to 5000 nm.

Still further, the cover electrode 42 is preferably provided from an edge portion of the full surface electrode 41 to a region around 2 to 10 µm away outwardly in planar view. Thus, the migration of Ag contained in the full surface electrode 41 can be prevented appropriately.

The cover electrode 42 can be formed by, for example, the sputtering method or the evaporation method.

(Metal Oxide Film)

The metal oxide film 43 is an insulation film which covers a surface of the cover electrode 42 and is provided to contact on a side surface of the p-side electrode 4p. The metal oxide film 43 functions with the insulation film 6 as protective film which prevents damage in the manufacturing process of the cover electrode 42. Further, the metal oxide film 43 is provided to contact on the p-side electrode 4p so that oxygen and water coming from a gap between the insulation film 6 and the p-side electrode 4p is prevented from contacting on the cover electrode 42. Consequently, the insulation film 6 is prevented from peeling from the cover electrode 42 effectively.

Further, the metal oxide film 43 is a film containing at least an oxide of a metal material forming the cover electrode 42. The metal oxide film 43 is a film formed by oxidizing the surface of the cover electrode 42, and is preferably formed with an Al oxide mainly. Thus, the cover electrode 42 can be adhered with the metal oxide film 43 properly. Further, in case that an oxide such as $SiO_2$ or $TiO_2$ is used as the insulation film 6, an adhesion property with the metallic cover electrode 42 is not necessarily high. While, as in the first embodiment, by covering via the metal oxide film 43 which is formed by the oxidized cover electrode 42, it is evaluated that the adhesion property between the insulation film 6 and the cover electrode 42 improves.

Film thickness of the metal oxide film 43 may be around 50 Å (5 nm).

(N-Side Electrode, p-Side Electrode)

The n-side electrode 4n and the p-side electrode 4p are pad electrodes for supplying the electric current from the outside to the semiconductor light emitting element 1. The n-side electrode 4n is electrically connected to the n-type semiconductor layer 31 and the p-side electrode 4p is electrically connected to the p-type semiconductor layer 33 via the cover electrode 42 and the full surface electrode 41, respectively.

The n-side electrode 4n is provided on the n-type semiconductor layer 31 which is a base surface of the stepped portion 3a of the semiconductor laminated body 3. In the first embodiment illustrated in FIG. 1A, the n-side electrodes 4n are provided respectively in the stepped portions 3a which are provided at the nine positions in the semiconductor laminated body 3.

Further, the p-side electrode 4p is provided on a portion of an upper surface of the cover electrode 42. In the embodiment illustrated in FIG. 1A, the p-side electrodes 4p each having an oblong and rectangular shape seen in planar view are provided at four positions on the upper surface of the cover electrode 42.

Preferably, the n-side electrode 4n has a good adhesion property with the n-type semiconductor layer 31, can be ohmic-connected properly, and is made of a material having low electric resistance. As such a material, a single layer film or a multilayer film of a metal of material such as Au, Cu, Ni, Al, Pt, or an alloy of these metals can be used. Further, a contact surface between the n-side electrode 4n and the n-type semiconductor layer 31 also functions as reflection film for reflecting the light which propagates in the semiconductor laminated body 3. Therefore, the contact surface preferably has high reflectance to the wavelength of the light emitted by the active layer 32. An Al or an Al-based alloy can be used as such a material, and, for example, an Al—Cu—Si alloy (for example, Cu: 2 mass %, Si: 1 mass %, Al: remainder), and an Al—Cu alloy (for example, Cu: 2 mass %, Al: remainder) can be used. Especially, the Al—Cu—Si alloy is preferably used, in which forward voltage Vf is decreased. An additive amount such as Cu, Si can be properly prepared, and around 0.1 to 10 mass % of Cu and around 0.1 to 10 mass % of Si can be contained.

Further, a multilayer film such as an Al—Cu—Si alloy/Ti/Pt/Au/Ti from, for example, a low layer side successively may be used in consideration of overall electric resistance and connectivity with the outside.

Preferably, the p-side electrode 4p has a good adhesion property with the cover electrode 42, and is made of a material having low electric resistance. The same material as the above described n-side electrode 4n can be used as such a material. Especially, in case of using an Al or an Al-based alloy as the cover electrode 42, the Al or the Al-based alloy is preferably used for the bottom layer of the p-side electrode 4p which contacts with at least the cover electrode 42. Thus, the adhesion property with the cover electrode 42 can be improved. Further, a multilayer film of an Al—Cu—Si alloy/Ti/Pt/Au/Ti may be used from the low layer side in consideration of overall electric resistance and connectivity with the outside.

The n-side electrode 4n and the p-side electrode 4p can be formed with the above described metal material by the evaporation method or the sputtering method.

Further, a metal bump (not illustrated) made of Au or Au—Sn eutectic crystal may be provided on the n-side electrode 4n and the p-side electrode 4p.

(Insulation Film)

The insulation film 6 is an insulation film which covers an exposed surface (upper surfaces and side surfaces of the stepped portions 3a, 3b) of the semiconductor laminated body 3, and functions as protective film and antistatic film of the semiconductor light emitting element 1. The insulation film 6 can be made of an oxide such as Si, Ti, Ta, Nb, and can be formed by a well-known method such as the evaporation method or the sputtering method. Film thickness of the insulation film 6 is preferably equal to or more than 100 nm and can be formed with $SiO_2$, for example, having about 350 nm film thickness.

In the first embodiment, the insulation film 6 does not cover upper portions (upper surfaces and upper portions of the side surfaces) of the n-side electrode 4n and the p-side electrode 4p as pad electrodes. Further, in the first embodiment, since the insulation film 6 covers the cover electrode 42 via the metal oxide film 43, the insulation film 6 adheres with the cover electrode 42 sufficiently.

Figure 2:
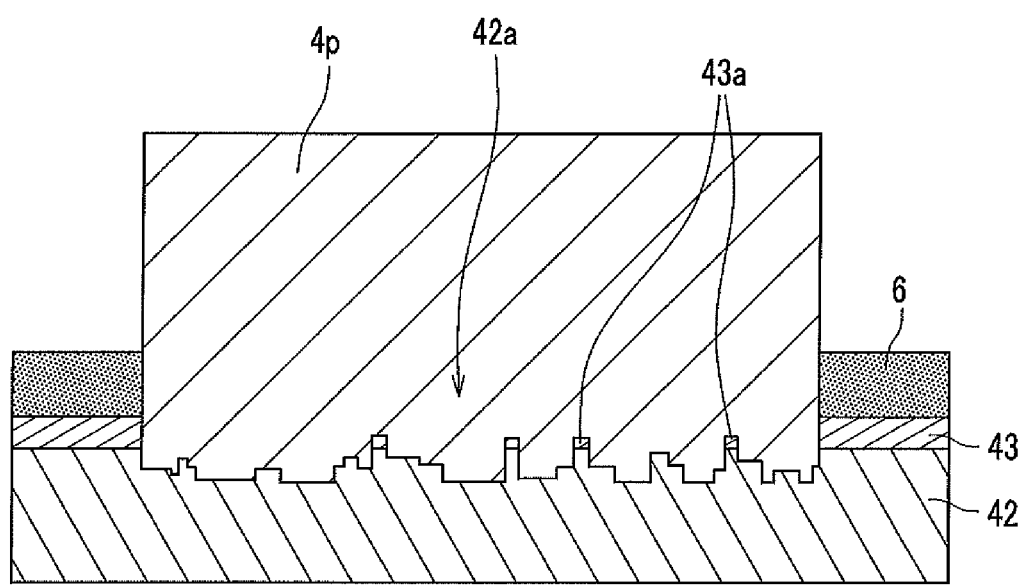
FIG. 2 is a schematically enlarged cross-sectional view of a connection portion between a cover electrode and a p-side electrode of the semiconductor light emitting element according to the first embodiment.

Referring to FIG. 2 (see FIGS. 1A to 1F as needed), a connection portion between the cover electrode 42 and the p-side electrode 4p will be explained.

As illustrated in FIG. 2, the p-side electrode 4p is provided on a concave part 42a formed on a portion of the upper surface of the cover electrode 42. Though the detail thereof will be described later, the concave part 42a is formed by removing the metal oxide film 43 and the insulation film 6 formed on the cover electrode 42 through etching and by further etching. Further, a base surface of the concave part 42a as a connecting surface with the p-side electrode 4p is formed in a rough surface. Further, the base surface of the concave part 42a may have a residue 43a of the metal oxide film 43 which has not been removed by etching. In other words, depth of the concave part 42a may be set to a degree that the metal oxide film 43 is almost removed or more than that.

Further, the adhesion property between the cover electrode 42 and the p-side electrode 4p is improved by providing the p-side electrode 4p on the rough-surfaced concave part 42a.

Further, as disclosed above, the surface of the cover electrode 42 is covered with the metal oxide film 43, and an edge portion of the metal oxide film 43 is provided to contact on the side surface of the p-side electrode 4p. Still further, the surface of the cover electrode 42 is further covered with the insulation film 6 via the metal oxide film 43. Shortly, the surface of the cover electrode 42 is covered with the metal oxide film 43 and the insulation film 6 doubly.

Thus, the cover electrode 42 is protected from oxygen and water in the atmosphere effectively and degradation of the cover electrode 42 is prevented. Consequently, prevention function of the cover electrode 42 to migration of Ag contained in the full surface electrode 41 can be maintained for a long time, and reliability of the semiconductor light emitting element 1 can be improved.

[Operation of the Semiconductor Light Emitting Element]

An operation of the semiconductor light emitting element 1 according to the first embodiment will be explained with reference to FIGS. 1A to 1F.

When the electric current is supplied from the outside via the metal bump or bonding wires (not illustrated) to the n-side electrode 4n and the p-side electrode 4p in the semiconductor light emitting element 1, the active layer 32 in the semiconductor laminated body 3 emits. The light emitted by the active layer 32 is extracted from the reverse surface side of the substrate 2. Light traveling in an opposite direction away from the light extraction surface in the light emitted by the active layer 32 is reflected by the full surface electrode 41 which functions as reflecting film, the contact surface between the cover electrode 42 and the p-type semiconductor layer 33, the contact surface between the n-side electrode 4n and the n-type semiconductor layer 31 and the like. Finally, the light is extracted from the reverse surface side of the substrate 2 as light extraction surface

[Method of Manufacturing a Nitride Semiconductor Light Emitting Element]

A method of manufacturing the semiconductor light emitting element 1 according to the first embodiment will be explained with reference to FIGS. 3A and 3B.

Figure 3A:
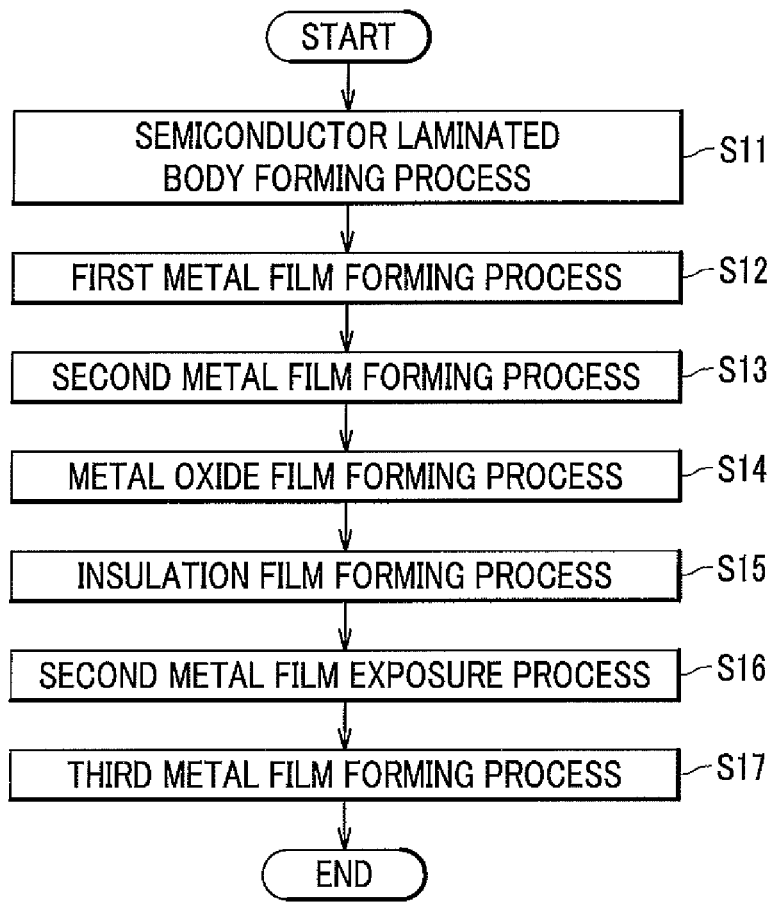
FIG. 3A is a flowchart illustrating all manufacturing processes for a method of manufacturing the semiconductor light emitting element according to the first embodiment.

As illustrated in FIG. 3A, the method of manufacturing the semiconductor light emitting element 1 includes a semiconductor laminated body forming process S11, a first metal film forming process S12, a second metal film forming process S13, a metal oxide film forming process S14, an insulation film forming process S15, a second metal film exposure process S16 and a third metal film forming process S17.

Figure 3B:
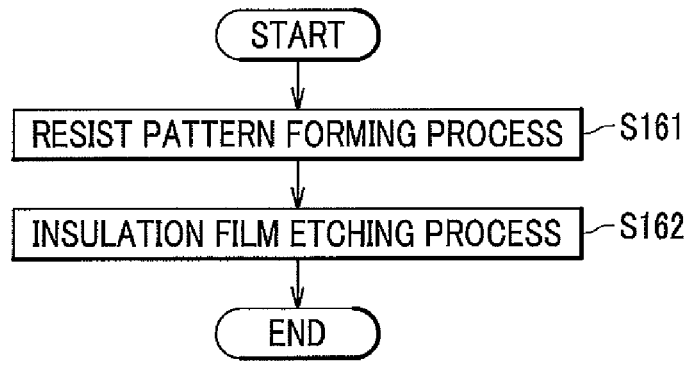
FIG. 3B is a detailed flowchart illustrating a second metal film exposure process.

Further, as illustrated in FIG. 3B, the second metal film exposure process S16 includes a resist pattern forming process 5161 and an insulation film etching process S162.

Each process will be explained in detail with reference to FIGS. 4A to 7B (see FIGS. 1A to 3B as needed). In the first embodiment, a case in which a nitride semiconductor is used as a semiconductor material will be explained.

Further, in FIGS. 3A to 7B, the substrate 2 is omitted, and each layer of the semiconductor laminated body 3 is not illustrated by hatching.

(Semiconductor Laminated Body Forming Process)

Figure 4A:
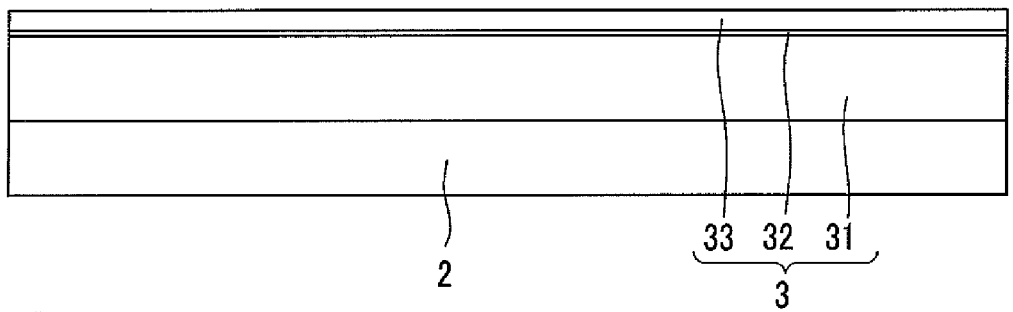
FIG. 4A is a schematic cross-sectional view of a formed semiconductor laminated body.

In the semiconductor laminated body forming process S11, as illustrated in FIG. 4A, the semiconductor laminated body 3 is formed on the translucent substrate 2 such as sapphire by a well-known manufacturing method. In the case illustrated in FIG. 4A, the semiconductor laminated body 3 is formed with the n-type semiconductor layer 31, the active layer 32 and the p-type semiconductor layer 33 laminated in that order.

The semiconductor laminated body forming process S11 will be briefly explained. Each nitride semiconductor forming the n-type semiconductor layer 31, the active layer 32 and the p-type semiconductor layer 33 is grown on the substrate 2 such as sapphire by the MOVPE method. Then, the substrate 2 (also referred to as wafer) on which each layer of the semiconductor laminated body 3 is grown is annealed in temperatures between 600 to 700 degrees Celsius in a nitride atmosphere. The p-type semiconductor layer 33 preferably has low resistivity.

(First Metal Film Forming Process)

Figure 4B:
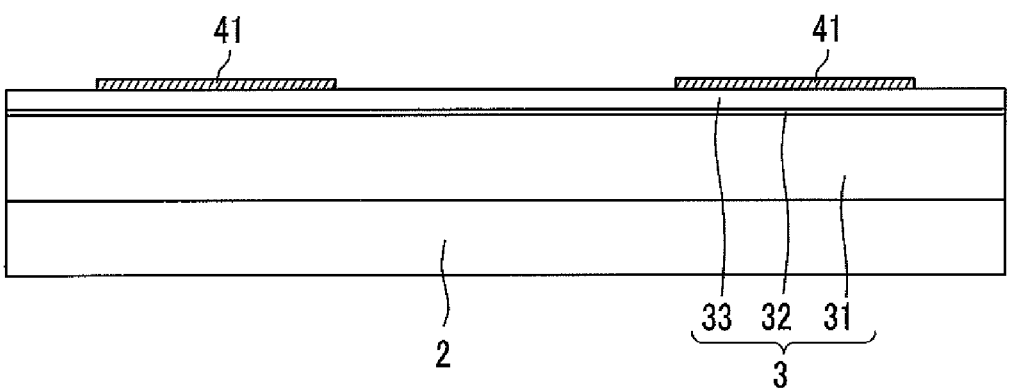
FIG. 4B is a schematic cross-sectional view of a formed full surface electrode.

In the first metal film forming process S12, a metal film is patterned to form at least the bottom layer of an Ag or an Ag-based alloy as the full surface electrode (first metal film) 41. Such a metal film can be formed with a multilayer film in which Ag/Ni/Ti/Ru is laminated from a low layer side successively by the sputtering method. Then, as illustrated in FIG. 4B, the full surface electrode 41 having a predetermined shape is formed by a photolithography method.

(Second Metal Film Forming Process)

In the second metal film forming process S13, the cover electrode (second metal film) 42 is formed.

Figure 4C:
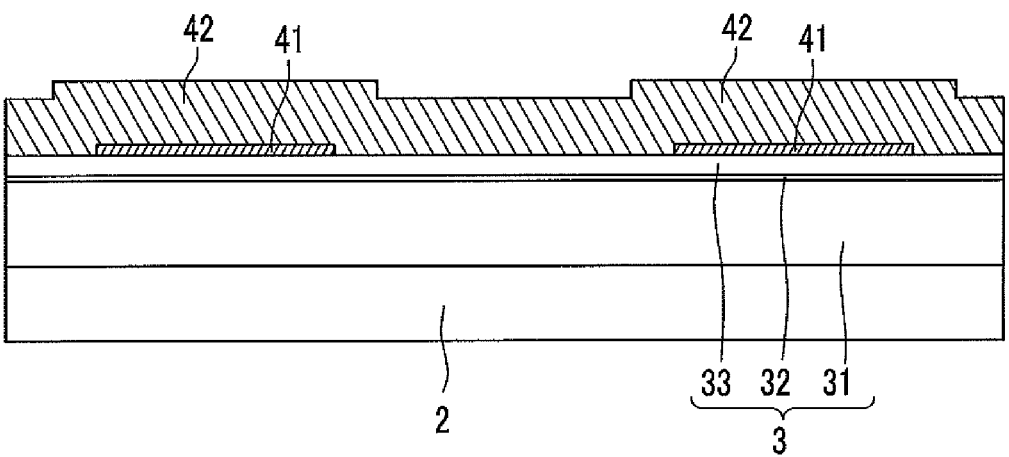
FIG. 4C is a schematic cross-sectional view of a formed metal film as cover electrode.

In the process, as illustrated in FIG. 4C, a metal film of an Al or an Al-based alloy such as an Al—Cu alloy is formed as the cover electrode 42 by the sputtering method over the wafer.

Figure 5A:
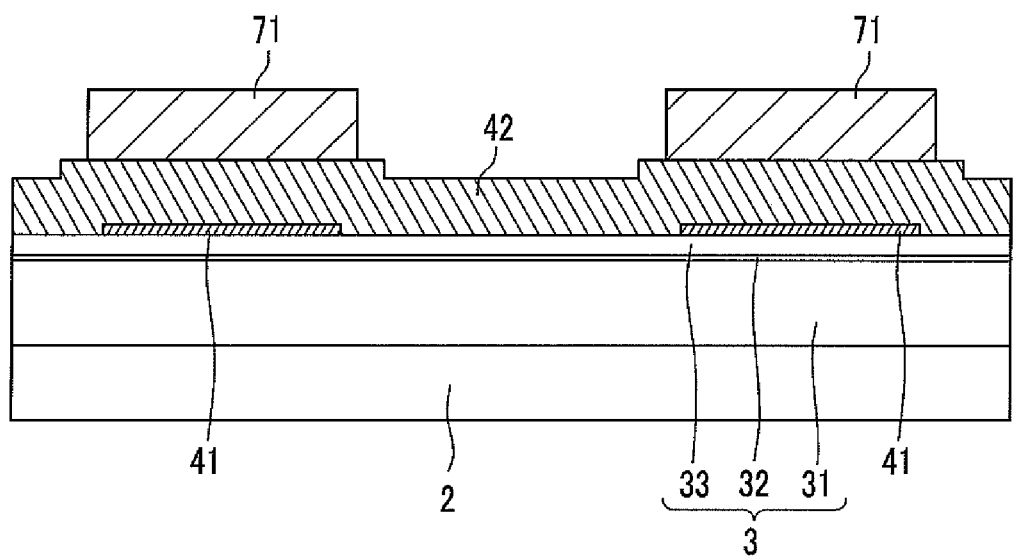
FIG. 5A is a schematic cross-sectional view of a formed resist pattern to shape a cover electrode.

Then, as illustrated in FIG. 5A, a resist pattern 71 for shaping the cover electrode 42 in a predetermined shape is formed on the metal film as the cover electrode 42 by the photolithography method. Shortly, a region where the resist pattern 71 is provided corresponds to a region where the cover electrode 42 in a predetermined shape is provided seen in planar view.

Figure 5B:
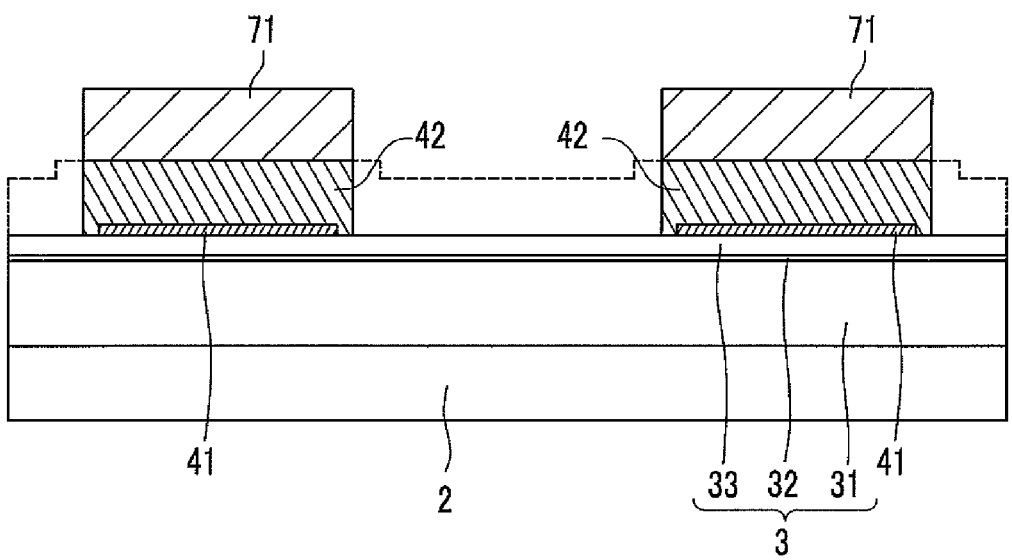
FIG. 5B is a schematic cross-sectional view of the shaped cover electrode.

Subsequently, as illustrated in FIG. 5B, a region of the metal film where the resist pattern 71 as mask is not provided is removed by etching to shape an outer shape of the cover electrode 42. After that, the resist pattern 71 is removed.

(Metal Oxide Film Forming Process)

Figure 5C:
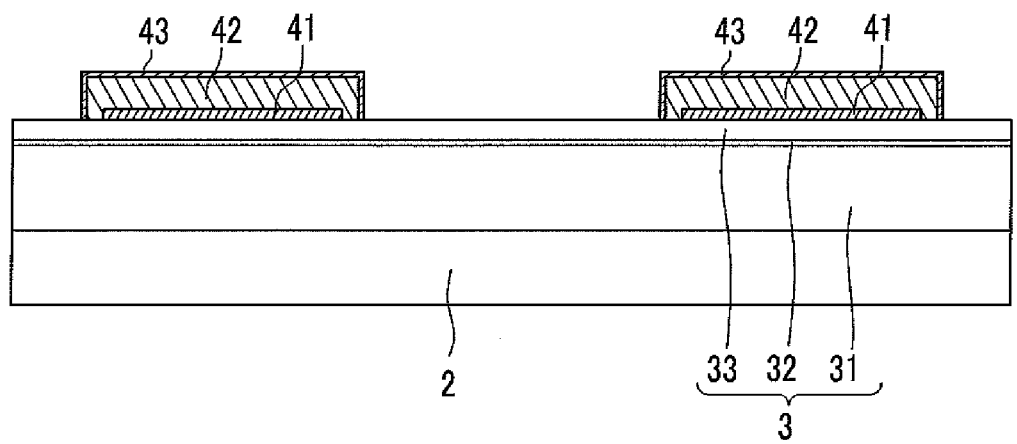
FIG. 5C is a schematic cross-sectional view of a formed metal oxide film.

In the metal oxide film forming process S14, as illustrated in FIG. 5C, the metal oxide film 43 having an Al oxide as a base is formed by oxidation treatment on an exposed surface of the cover electrode 42. The oxidation treatment on the cover electrode 42 may be carried out by (a) a processing method with an oxidizing solution such as nitric acid or sulfuric acid, (b) asking with ultraviolet light or the like, (c) a cleansing method with ozone or the like, (d) an annealing method in an oxygen atmosphere, or (e) a hydrothermal treatment.

Further, in the second metal film forming process S13 as a previous process, the metal oxide film forming process S14 may be achieved by a heat treatment or use of the oxidizing solution in the course of removing the resist pattern 71 after the cover electrode 42 is shaped.

Still further, Al as a base of the cover electrode 42 is oxidized by being left in an atmosphere (shortly, under oxygen), and the metal oxide film 43 having an Al oxide as a base can be formed.

Figure 5D:
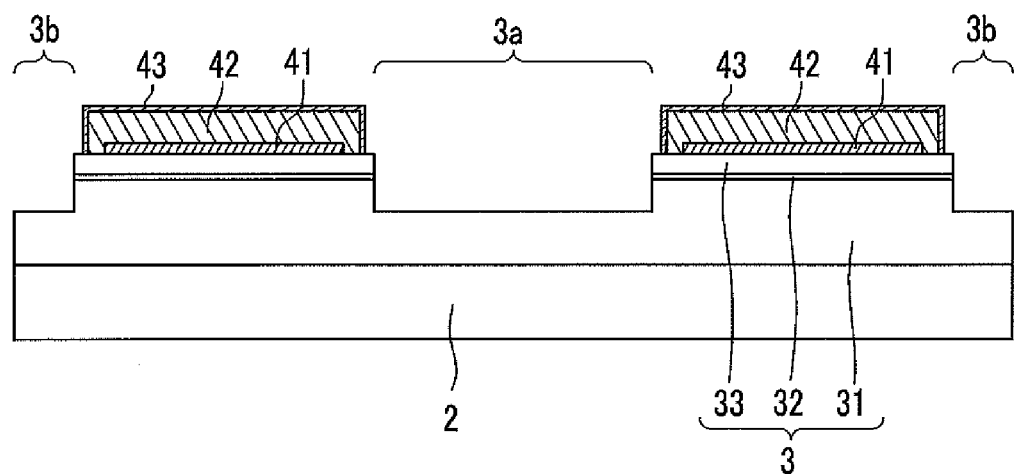
FIG. 5D is a schematic cross-sectional view of a formed stepped portion.

As illustrated in FIG. 5D, the stepped portion 3a for providing the n-side electrode 4n and the stepped portion 3b as cutting region for the semiconductor light emitting element 1 are exposed. A predetermined-shaped mask is formed on the wafer after annealing by photoresist and all of the p-type semiconductor layer 33 and the active layer 32 are removed in a thickness direction by reactive ion etching (RIE). Further, a portion of the n-type semiconductor layer 31 is removed to expose the n-type semiconductor layer 31. After the etching, the resist is removed.

The full surface electrode 41 is provided away from edge portions of the stepped portions 3a, 3b such that the side surface thereof is covered by the cover electrode 42.

Either one of processes of the metal oxide film forming processes illustrated in FIG. 5C and the forming process of the stepped portions 3a, 3b illustrated in FIG. 5D may be performed prior to the other.

(Insulation Film Forming Process)

Figure 6A:
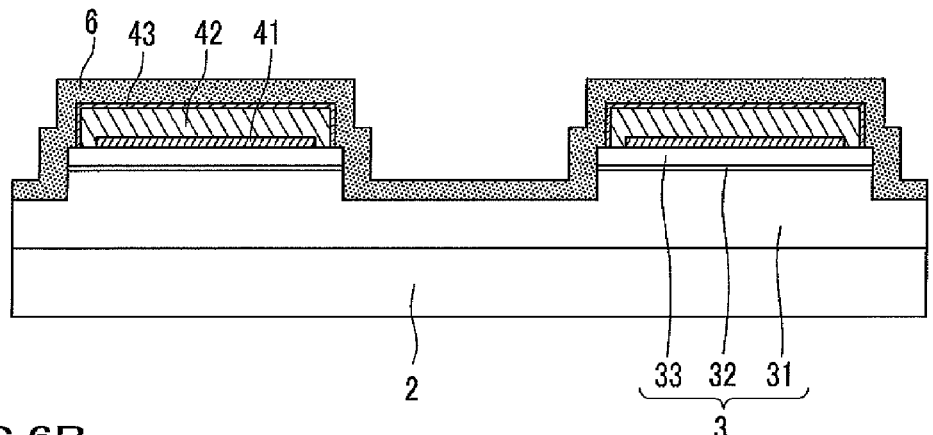
FIG. 6A is a schematic cross-sectional view of a formed insulation film.

In the insulation film forming process S15, as illustrated in FIG. 6A, an insulating oxide such as $SiO_2$ or the like is laminated over a surface of the wafer by the sputtering method or a CVD method to form the insulation film 6.

(Second Metal Film Exposure Process)

In the second metal film exposure process S16, a region of the cover electrode (second metal film) 42 where the p-side electrode 4p is provided is exposed by etching. In the first embodiment, the n-type semiconductor layer 31 of the region where the n-side electrode 4n is provided is exposed simultaneously in the process.

Figure 6B:
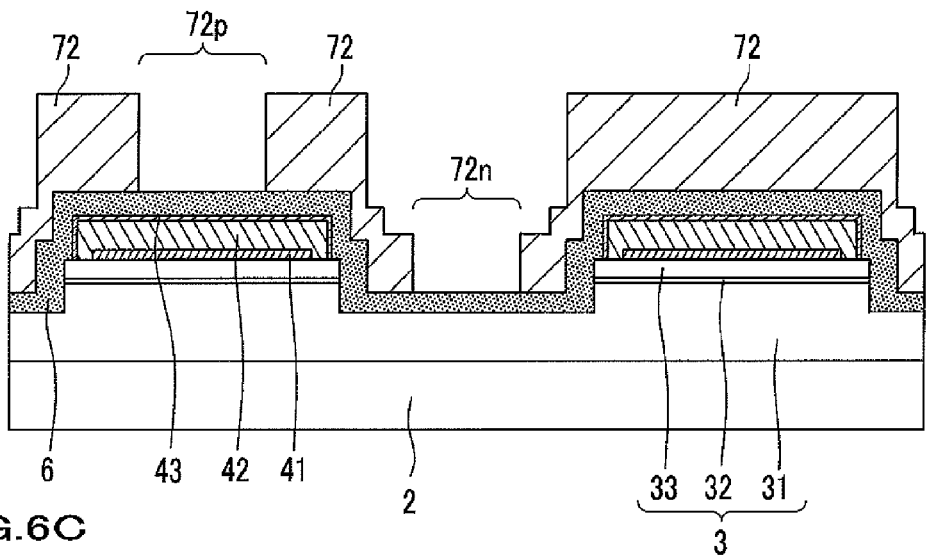
FIG. 6B is a schematic cross-sectional view of a formed resist pattern to form a p-side electrode and an n-side electrode.

To do this, as illustrated in FIG. 6B, a resist pattern is formed in a resist pattern forming process 5161 as a sub-process of the second metal film exposure process S16. The resist pattern 72 has an opening (resist opening) 72p where the p-side electrode 4p is provided and an opening 72n where the n-side electrode 4n is formed.

Figure 6C:
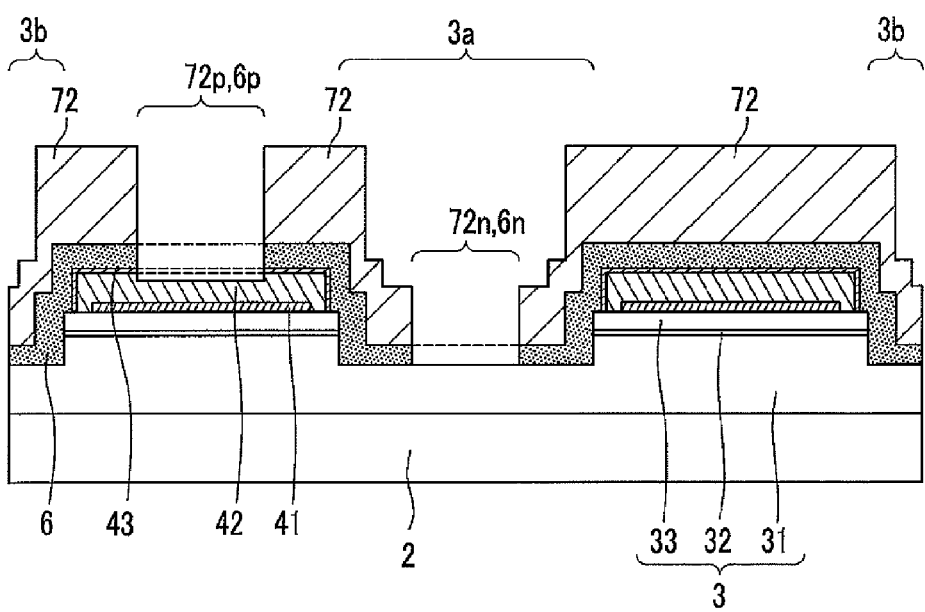
FIG. 6C is a schematic cross-sectional view of exposed cover electrode and an n-type semiconductor layer.

As illustrated in FIG. 6C, the openings 6p, 6n are formed by removing the insulation film 6 in the openings 72p, 72n having the resist pattern 72 as mask in an insulation film etching process S162 as a next sub-process of the second metal film exposure process S16.

Thus, the cover electrode (second metal film) 42 of the region where the p-side electrode 4p is provided is exposed, and the n-type semiconductor layer 31 of the region where the n-side electrode 4n is provided is exposed.

Further, the metal oxide film 43 is removed in the opening 72p and a portion of the cover electrode 42 is removed in the thickness direction by further etching to form the concave portion 42a (see FIG. 2). At this time, a base surface of the concave portion 42a, that is, an exposed surface of the cover electrode 42 is preferably roughened.

The metal oxide film 43 is not necessarily removed completely and may be removed to the extent that the residue 43a (see FIG. 2) remains.

Further, the concave portion 42a can be formed by removing to the extent that the full surface electrode 41 is not exposed, for example, by removing the cover electrode 42 around several nm to 2500 nm in the thickness direction, though depending on the thickness of the cover electrode 42.

As an etching agent for roughening the cover electrode 42 made of an Al or an Al-based alloy by etching, for example, hydrofluoric acid or mixed acid containing hydrofluoric acid may be used. Further, a buffer agent such as ammonium fluoride may be added appropriately. Degree of roughness can be controlled by adjusting temperature at a time of etching.

In the next process of the third metal film forming process S17, in case that the bottom layer of the p-side electrode 4p is made of a metal material of an Al or an Al-based alloy, by roughening the exposed portion of the cover electrode 42, the Al-based material in the bottom layer of the p-side electrode 4p attaches on the entire exposed surface of the cover electrode 42 of an Al or an Al-based alloy, resulting in film growth. Therefore, a contact area between the cover electrode 42 and the p-side electrode 4p increases, and the adhesion property, that is, bond strength can be more improved. Further, in addition to the increase of the contact area by roughening, since both the cover electrode 42 and at least the bottom layer of the p-side electrode 4p are made of an Al-based material, the bond strength can be more improved.

(Third Metal Film Forming Process)

Figure 7A:
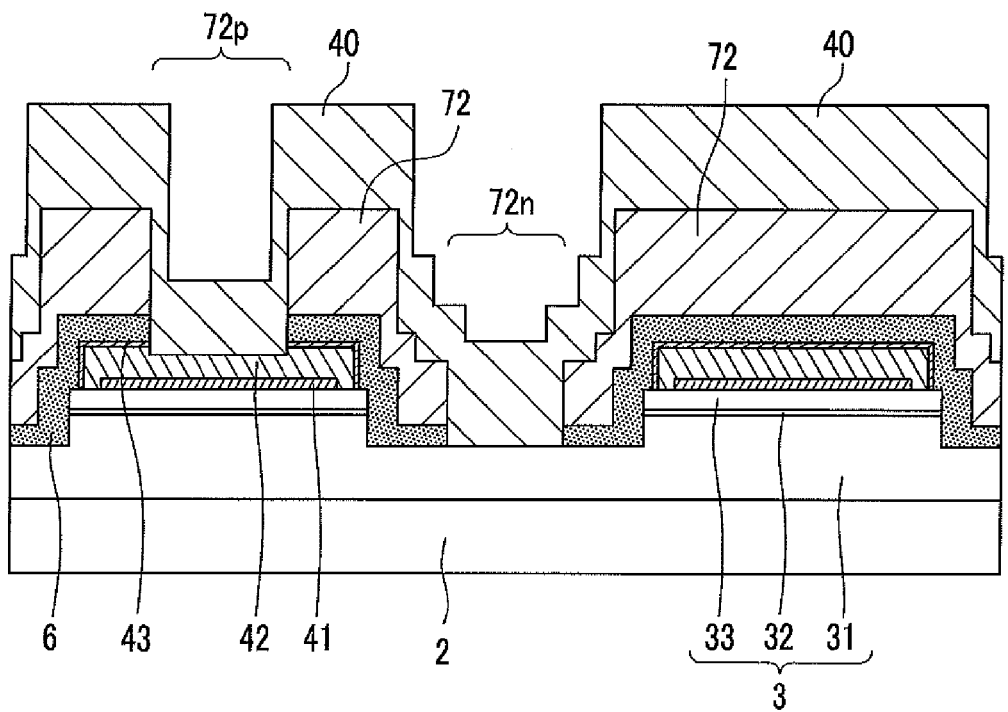
FIG. 7A is a schematic cross-sectional view of a formed metal film as a p-side electrode and a n-side electrode.

In the third metal film forming process S17, as illustrated in FIG. 7A, a metal film 40 to become the p-side electrode (third metal film) 4p and the n-side electrode 4n is formed over the wafer while the resist pattern 72 formed in the second metal film exposure process S16 is maintained. In the first embodiment, at least the bottom layer is formed with an Al or an Al-based alloy. Further, the metal film 40 may be a single layer film of an Al or an Al alloy, or a multilayer film in which a different material is laminated on an upper layer.

In the first embodiment, the n-side electrode 4n and the p-side electrode 4p are formed with the same material, but a different material may be used to form the n-side electrode 4n by separating the forming process of the n-side electrode 4n.

Figure 7B:
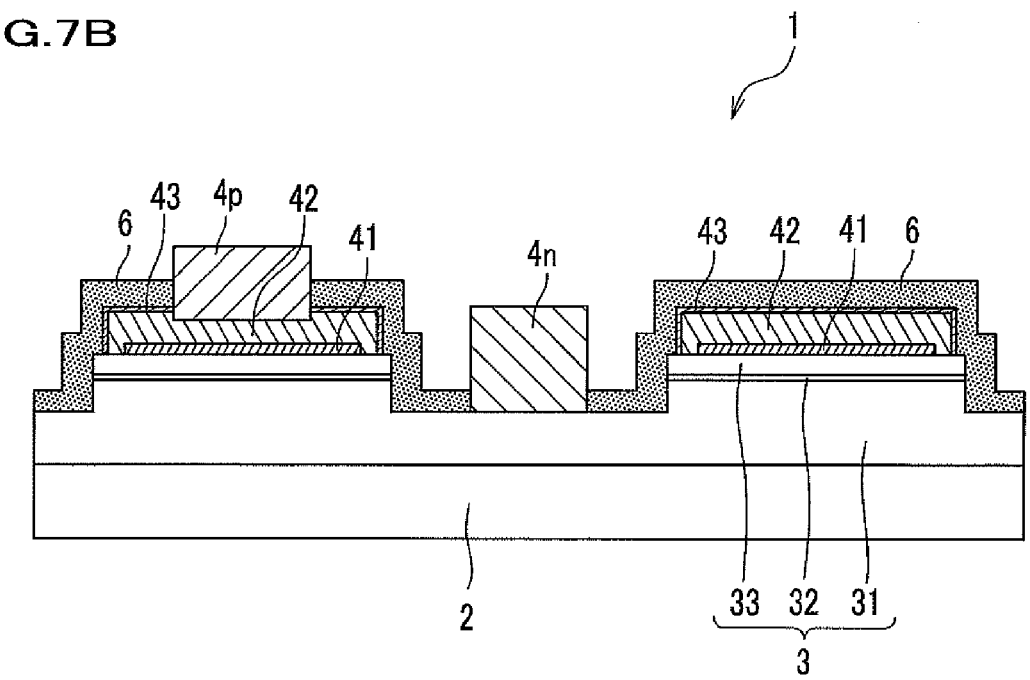
FIG. 7B is a schematic cross-sectional view of a shaped p-side electrode and an n-side electrode.

Next, by removing (lifting-off) the resist pattern 72 with the metal film 40 laminated thereon, as illustrated in FIG. 7B, the semiconductor light emitting element 1 is manufactured in which the p-side electrode 4p and the n-side electrode 4n are shaped in a predetermined form.

Though not illustrated, by cutting the stepped portion 3b as cutting region by a scribing method or a dicing method, the semiconductor emitting element 1 can be formed as a chip structure.

<Second Embodiment>

[Structure of a Semiconductor Light Emitting Element]

Figure 8A:
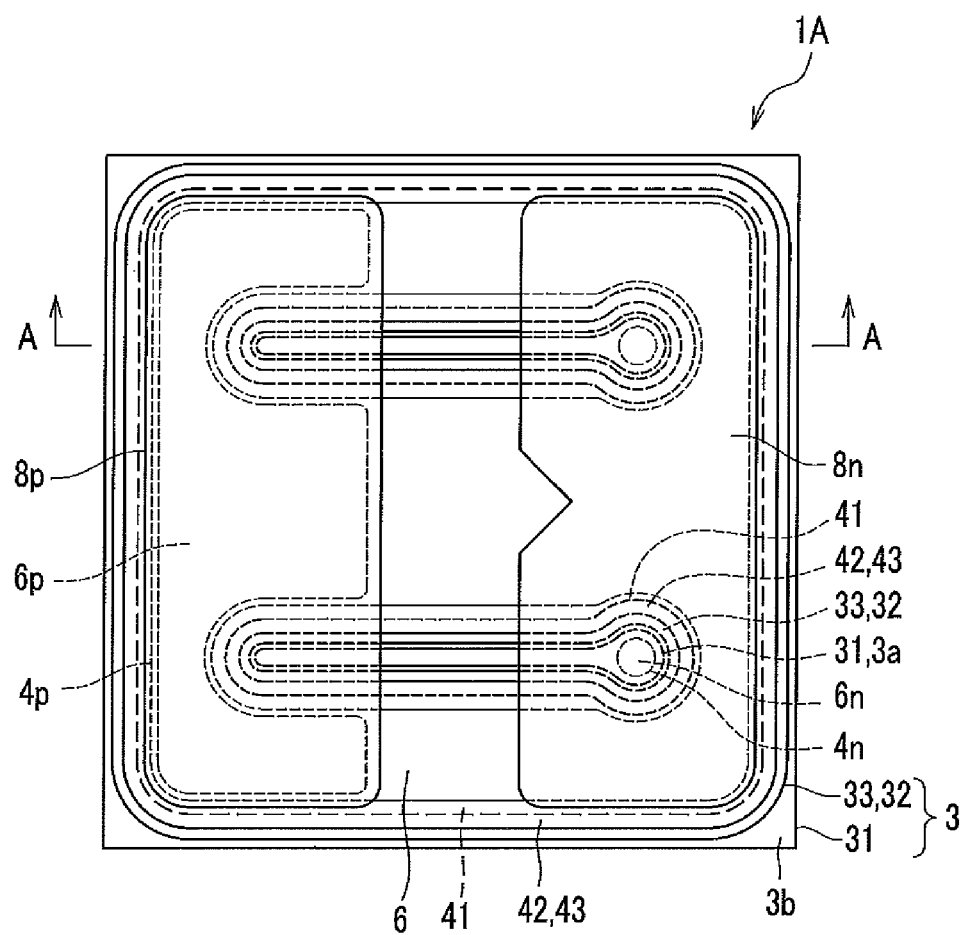
FIG. 8A is a schematic planar view illustrating a structure of a semiconductor light emitting element according to a second embodiment.
Figure 8B:
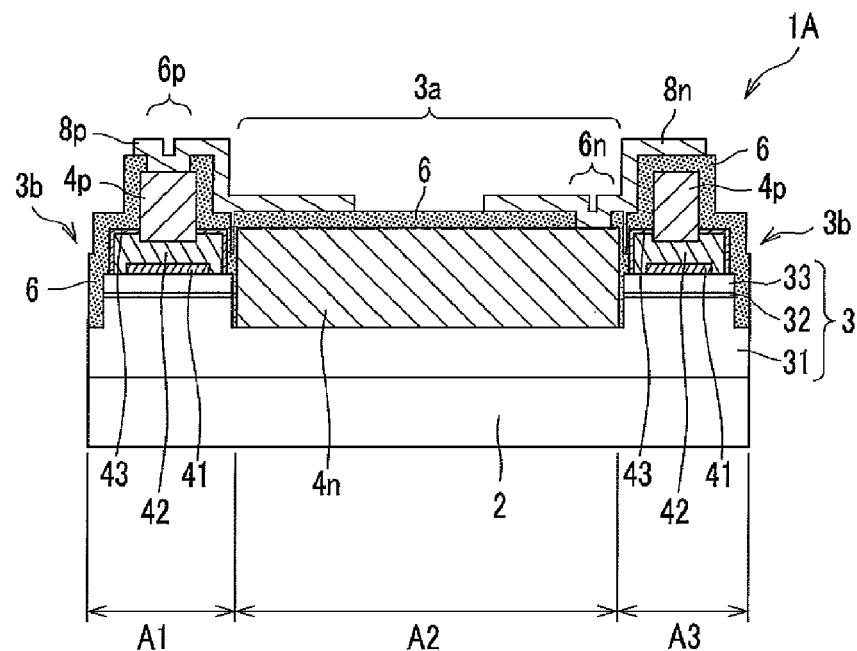
FIG. 8B is a cross-sectional view along A-A line in FIG. 8A.
Figure 8C:
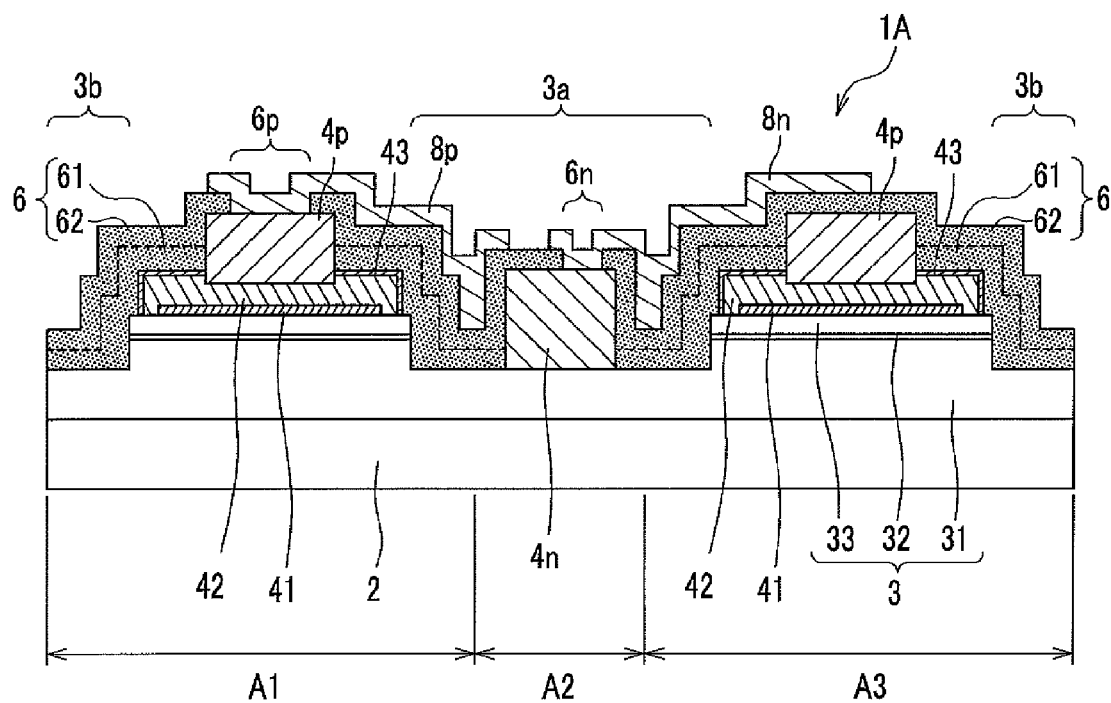
FIG. 8C is a cross-sectional view illustrating the partially scaled cross-section along A-A line in FIG. 8A.

A structure of a semiconductor light emitting element according to a second embodiment will be explained with reference to FIGS. 8A to 8C. A semiconductor light emitting element 1A according to the second embodiment is an LED for flip-chip mounting. As illustrated in FIGS. 8A to 8C, the semiconductor light emitting element 1A has the substrate 2, the semiconductor laminated body 3 laminated on the substrate 2, the n-side electrode 4n, an n-side eutectic pad electrode 8n (fourth metal film), the full surface electrode 41, the cover electrode 42, the metal oxide film 43, the p-side electrode 4p, a p-side eutectic pad electrode 8p (fifth metal film) and the insulation film 6. In the second embodiment, to fit for flip-chip mounting, both the n-side electrode 4n and the p-side electrode 4p are provided on a surface of the substrate 2 where the semiconductor laminated body 3 is provided.

The semiconductor light emitting element 1A according to the second embodiment differs from the semiconductor light emitting element 1 according to the first embodiment illustrated in FIGS. 1A to 1F in that the p-side eutectic pad electrode 8p and the n-side eutectic pad electrode 8n are further provided.

In FIG. 8A, the insulation film 6 and the metal oxide film 43 are omitted. Further, in a cross-sectional view illustrated in FIG. 8B, each layer of the substrate 2 and the semiconductor laminated body 3 is not illustrated by hatching. FIG. 8C is a cross-sectional view along A-A line in FIG. 8A. FIG. 8C illustrates widths of members and spaces therebetween by scaling as needed to make an internal structure of the semiconductor light emitting element clearer. Areas Al to A3 in FIG. 8C correspond to areas A1 to A3 in FIG. 8B, respectively. Shortly, FIG. 8C illustrates the expanded areas A1 and A3 and the shortened area A2 in a horizontal direction with respect to FIG. 8B.

(P-Side Eutectic Pad Electrode, n-Side Eutectic Pad Electrode)

The p-side eutectic pad electrode (fifth metal film) 8p and the n-side eutectic pad electrode (fourth metal film) 8n are pad electrodes which are connected by an Au—Sn eutectic solder or the like when the semiconductor light emitting element 1A is mounted. The p-side eutectic pad electrode 8p is electrically connected to an upper surface of the p-side electrode 4p in the opening 6p of the insulation film 6 and is provided to extend over a wide range at a left region in FIG. 8A on the insulation film 6. Further, the n-side eutectic pad electrode 8n is electrically connected to an upper surface of the n-side electrode 4n in the opening 6n of the insulation film 6 and is provided to extend over a wide range at a right region in FIG. 8A on the insulation film 6. Still further, both the p-side eutectic pad electrode 8p and the n-side eutectic pad electrode 8n extend approximately as high as the insulation film 6 provided above the p-type semiconductor layer 33 seen from an upper surface of the substrate 2. Therefore, since heights of upper ends of the p-side eutectic pad electrode 8p and the n-side eutectic pad electrode 8n as connection portions for flip-chip mounting align, a difference in height is not formed between a p-side electrode connection surface and a n-side electrode connection surface and reliability of mounting can be increased.

Such a structure of the pad electrode is appropriately referred as a solid wiring structure hereinafter. In the second embodiment, electrodes for the solid wiring in the semiconductor light emitting element are refereed as eutectic pad electrodes (the p-side eutectic pad electrode 8p and the n-side eutectic pad electrode 8n). However, the connection at the time of mounting is not limited by the eutectic solder and the pad electrodes can be used for an external connection widely. Other embodiments having the solid wiring structure disclosed later are the same.

The p-side eutectic pad electrode 8p and the n-side eutectic pad electrode 8n have a good adhesion property with the p-side electrode 4p, the n-side electrode 4n and the insulation film 6 on which the pads 8p and 8n are provided, and are preferably metal films having low electric resistance as a whole. A multilayer film laminated with Ti/Ni/Au from, for example, a low layer side sequentially can be used.

Further, the second embodiment illustrated in FIG. 8A, the stepped portions 3a each having an oblong shape seen in planar view are provided at two positions. A right end portion of each stepped portion 3a has a region which bulges in a circle seen in planar view, and the opening 6n of the insulation film 6 is formed in the circled region, through which the n-side electrode 4n is connected to the n-side eutectic pad electrode 8n. Further, since the p-side electrode 4p which is provided on the p-type semiconductor layer 33 (at a right side in FIG. 8B) on which the n-side eutectic pad electrode 8n extends is not connected to the p-side eutectic pad electrode 8p directly. Therefore, the p-side electrode 4p can be omitted. However, the p-side electrode 4p is preferably provided so as to align the heights of the n-side eutectic pad electrode 8n and the p-side eutectic pad electrode 8p with respect to the upper surface of the substrate 2.

Further, as the embodiment, since the p-side eutectic pad electrode 8p and the n-side eutectic pad electrode 8n extend over a wide range, heat dissipation of the semiconductor light emitting element 1A can be improved. An area and a place where the p-side eutectic pad electrode 8p and the n-side eutectic pad electrode 8n extend can be appropriately designed in consideration of mountability and heat dissipation.

In the second embodiment illustrated in FIGS. 8A to 8C, the p-side eutectic pad electrode 8p extends onto the insulation film 6 provided on the n-side electrode 4n in the stepped portion 3a.

Further, the insulation film 6 has two layers, one of which being a first insulation film 61 provided as the insulation film 6 in the first embodiment, and the other of which being a second insulation film 62 provided to cover onto the side surfaces and the upper surfaces except the openings 6p, 6n of the p-side electrode 4p and the n-side electrode 4n. On this account, thickness of the insulation film 6 on the upper surfaces of the p-side electrode 4p and the n-side electrode 4n is formed thinner than other regions. The first insulation film 61 and the second insulation film 62 are made of the same material and are integrated films practically.

[Operation of the Semiconductor Light Emitting Element]

The semiconductor light emitting element 1A according to the second embodiment is the same as the semiconductor light emitting element 1 according to the first embodiment, except the shape and the number of arranged n-side electrodes 4n and that the electric current is supplied from the outside via the p-side eutectic pad electrode 8p and the n-side eutectic pad electrode 8n. Therefore, an explanation for operation will be omitted.

[Method of Manufacturing the Semiconductor Light Emitting Element]

Next, a method of manufacturing the semiconductor light emitting element 1A according to the second embodiment will be explained with reference to FIG. 9.

Figure 9:
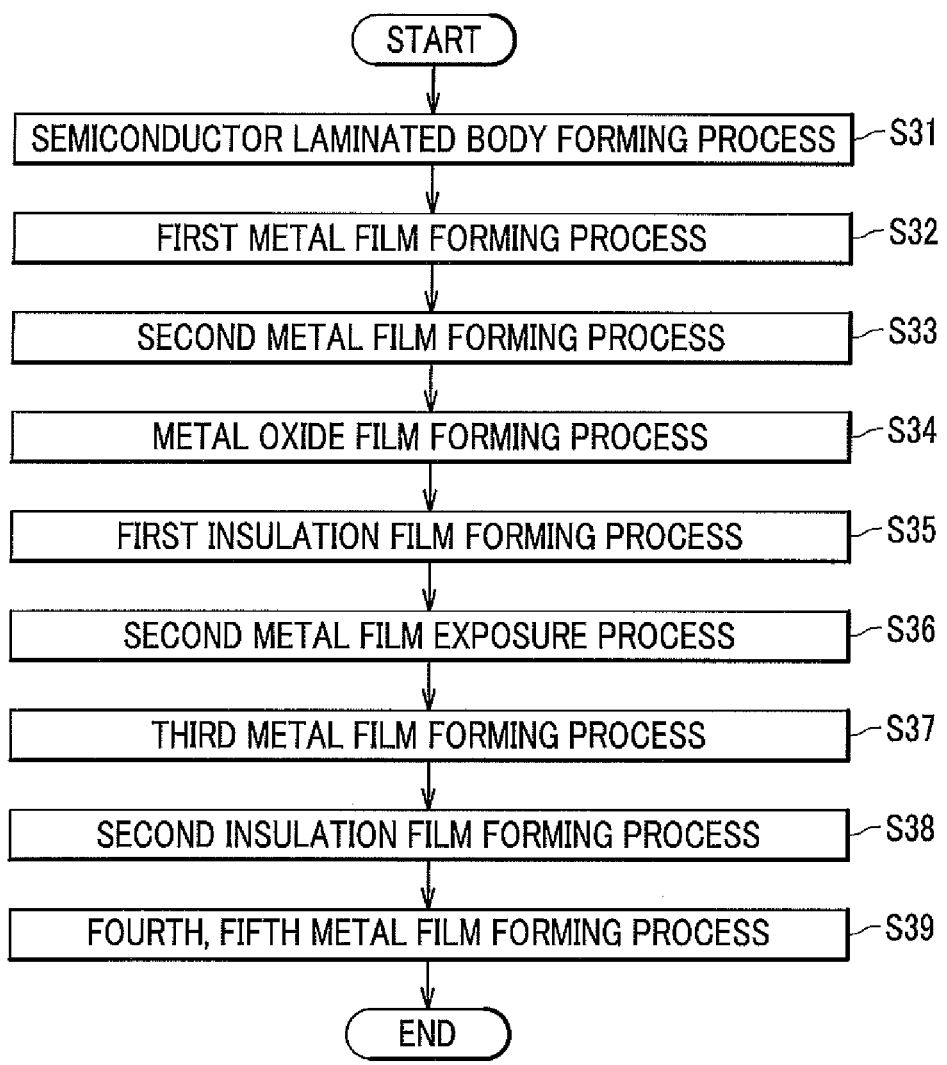
FIG. 9 is a flowchart illustrating a method of manufacturing the semiconductor light emitting element according to the second embodiment.

As illustrated in FIG. 9, the method of manufacturing the semiconductor light emitting element 1A according to the second embodiment includes a semiconductor laminated body forming process S31, a first metal film forming process S32, a second metal film forming process S33, a metal oxide film forming process S34, a first insulation film forming process (insulation film forming process) S35, a second metal film exposure process S36, a third metal film forming process S37, a second insulation film forming process S38 and a fourth, fifth metal film forming process S39.

The semiconductor laminated body forming process S31, the first metal film forming process S32, the second metal film forming process S33 and the metal oxide film forming process S34 are the same as the semiconductor laminated body forming process S11, the first metal film forming process S12, the second metal film forming process S13 and the metal oxide film forming process S14 in the method of manufacturing the semiconductor light emitting element of the first embodiment illustrated in FIG. 3A, respectively. Therefore, explanations thereof will be omitted.

Further, the first insulation film forming process S35 and the second metal film exposure process S36 are realized by etching after forming the first insulation film 61 as the insulation film 6 in the first embodiment in the insulation film forming process S15 and the second metal film exposure process S16 in the first embodiment. Therefore, explanations thereof will be omitted. Further, since the third metal film forming process S37 is the same as the third metal film forming process S17 in the first embodiment, an explanation thereof will be omitted.

Figure 10A:
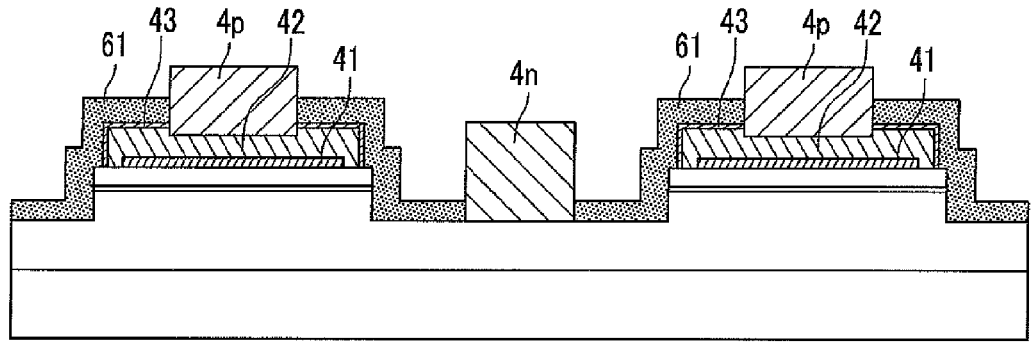
FIG. 10A is a schematic cross-sectional view of a formed first insulation film, a p-side electrode and a n-side electrode.
Figure 10B:
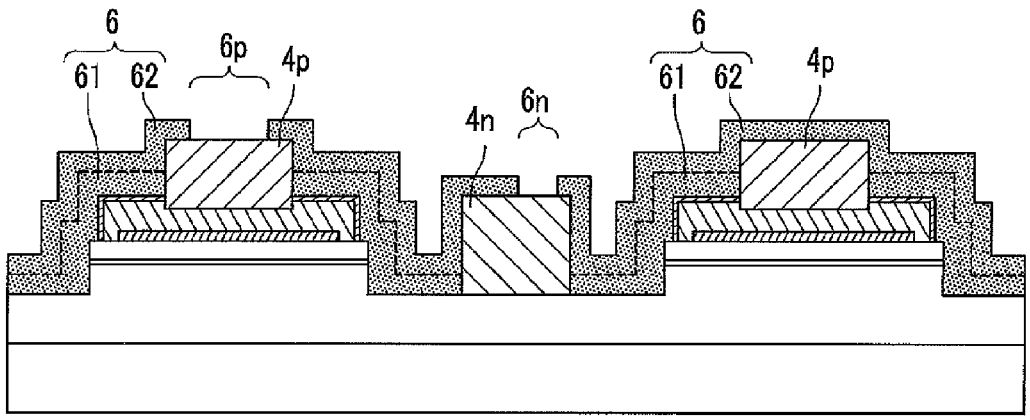
FIG. 10B is a schematic cross-sectional view of a formed second insulation film.
Figure 10C:
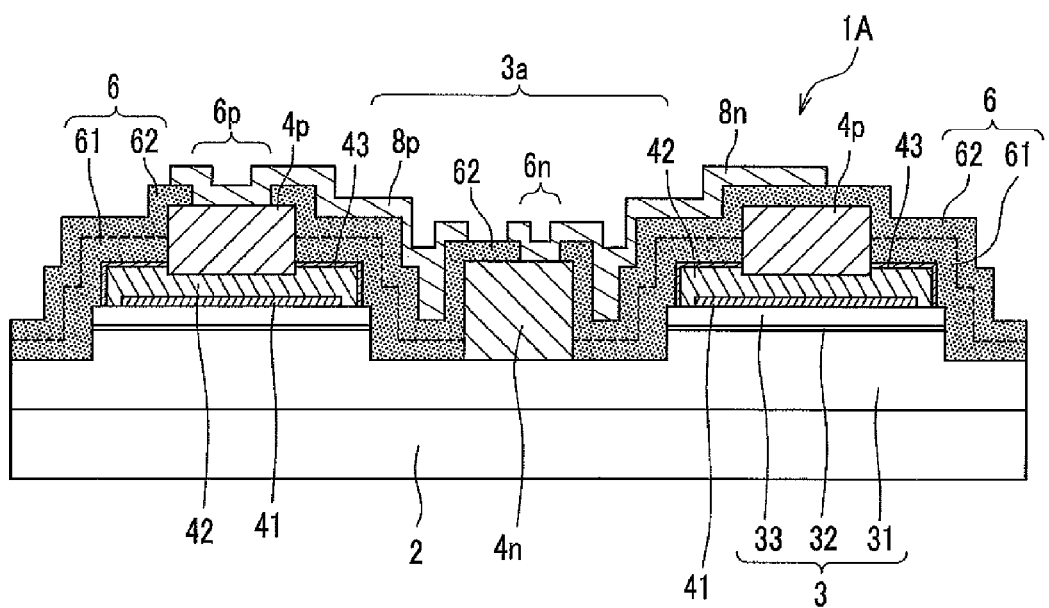
FIG. 10C is a schematic cross-sectional view of a formed eutectic pad electrode.

Referring to FIGS. 10A to 10C (FIGS. 8A to 9 as needed), following processes will be explained hereinbelow.

In FIGS. 10A to 10C, the substrate 2 is omitted. Further, each layer of the semiconductor laminated body 3 is not illustrated by hatching.

FIG. 10A illustrates a state after the semiconductor laminated body forming process S31, the first metal film forming process S32, the second metal film forming process S33, the metal oxide film forming process S34, the first insulation film forming process S35, the second metal film exposure process S36 and the third metal film forming process S37 are performed sequentially. In the second embodiment, the p-side electrode (third metal film) 4p is formed on a region (on the cover electrode 42 at a right side in FIG. 10A) where the n-side eutectic pad electrode (fourth metal film) 8n extends, in addition to on a region (on the cover electrode 42 at a left side in FIG. 10A) where the p-side eutectic pad electrode (fifth metal film) 8p formed in a post-process is connected. Further, portions except the upper surfaces and upper portions of the side surfaces of the p-side electrode 4p and the n-side electrode 4n are covered with the first insulation film 61.

In the third metal film forming process S37, preferably, an Al or an Al-based alloy is used for the bottom layer of the p-side electrode 4p, and a material which does not contain an Al and with which a passive film such as an oxide is hardly formed is used for an upper layer thereon. Thus, a passive film is not formed by chemicals or in a hot environment used in the post-processes such as the second insulation film forming process S38 and in an initial stage of the fourth, fifth metal film forming process S39. Therefore, the p-side electrode 4p can be electrically connected to the p-side eutectic pad electrode 8p properly. Consequently, a high reliable semiconductor light emitting element 1A can be formed.

Further, in the second embodiment, the p-side eutectic pad electrode 8p which extends over a wide range on the insulation film 6 is not directly bonded to the cover electrode 42 which contains Al so that a passive film is easily formed thereon, but is bonded via the p-side electrode (third metal film) 4p by the above-mentioned process. Therefore, a passive film is not formed between the cover electrode 42 and the p-side eutectic pad electrode 8p, and the cover electrode 42 can be electrically connected to the p-side eutectic pad electrode 8p properly.

(Second Insulation Film Forming Process)

In the second insulation film forming process S38, as illustrated in FIG. 10B, the second insulation film 62 having the openings 6p, 6n is formed on the surface of the wafer with the same material as the first insulation film 61.

In the process, the second insulation film 62 is formed over the wafer by the same method for the first insulation film 61. Then, the opening 6p is formed in a region where the p-side electrode 4p is connected to the p-side eutectic pad electrode 8p, and the opening 6n is formed in a region where the n-side electrode 4n is connected to the n-side eutectic pad electrode 8n by the known photolithography method, respectively, in the second insulation film 62. Portions of the upper surfaces of the p-side electrode 4p and the n-side electrode 4n are exposed.

(Fourth, Fifth Metal Film Forming Process)

In the fourth, fifth metal film forming process S39, as illustrated in FIG. 10C, the p-side eutectic pad electrode (fifth metal film) 8p and the n-side eutectic pad electrode (fourth metal film) 8n are formed. In the second embodiment, the p-side eutectic pad electrode 8p is provided to be electrically connected to the p-side electrode 4p illustrated at a left side in FIG. 10C through the opening 6p of the second insulation film 62 and to extend onto the second insulation film 62 which covers the upper surface of the n-side electrode 4n in the stepped portion 3a. Further, the n-side eutectic pad electrode 8n is provided to be electrically connected to the n-side electrode 4n in the stepped portion 3a through the opening 6n of the second insulation film 62 and to extend onto the second insulation film 62 which covers the upper surface of the p-side electrode 4p illustrated at a right side in FIG. 10C.

The p-side eutectic pad electrode 8p and the n-side eutectic pad electrode 8n are provided separately from each other to the extent that they do not short-circuit. Further, the regions where the p-side eutectic pad electrode 8p and the n-side eutectic pad electrode 8n extend are electrically insulated from the semiconductor laminated body 3, the p-side electrode 4p and the n-side electrode 4n except the openings 6p, 6n by the insulation film 6 having the first insulation film 61 and the second insulation film 62.

The p-side eutectic pad electrode 8p and the n-side eutectic pad electrode 8n can be formed by the lift-off method or the photolithography method. For example, in the lift-off method, firstly, a resist pattern is formed. The resist pattern masks except the regions where the p-side eutectic pad electrode 8p and the n-side eutectic pad electrode 8n are arranged. Secondly, a metal film is formed with a metal material with which the p-side eutectic pad electrode 8p and the n-side eutectic pad electrode 8n are formed. Finally, the metal film formed on the resist pattern is removed (lifted off) with the resist pattern. As a result, the p-side eutectic pad electrode 8p and the n-side eutectic pad electrode 8n having predetermined forms can be shaped.

The semiconductor light emitting element 1A according to the second embodiment can be manufactured by the processes explained above.

<Third Embodiment>

A structure of a semiconductor light emitting element according to a third embodiment will be explained with reference to FIGS. 11A to 11C. A semiconductor light emitting element 1B according to the third embodiment is an LED for flip-chip mounting and has a solid wiring structure as the semiconductor light emitting element 1A according to the second embodiment illustrated in FIGS. 8A to 8C.

Figure 11A:
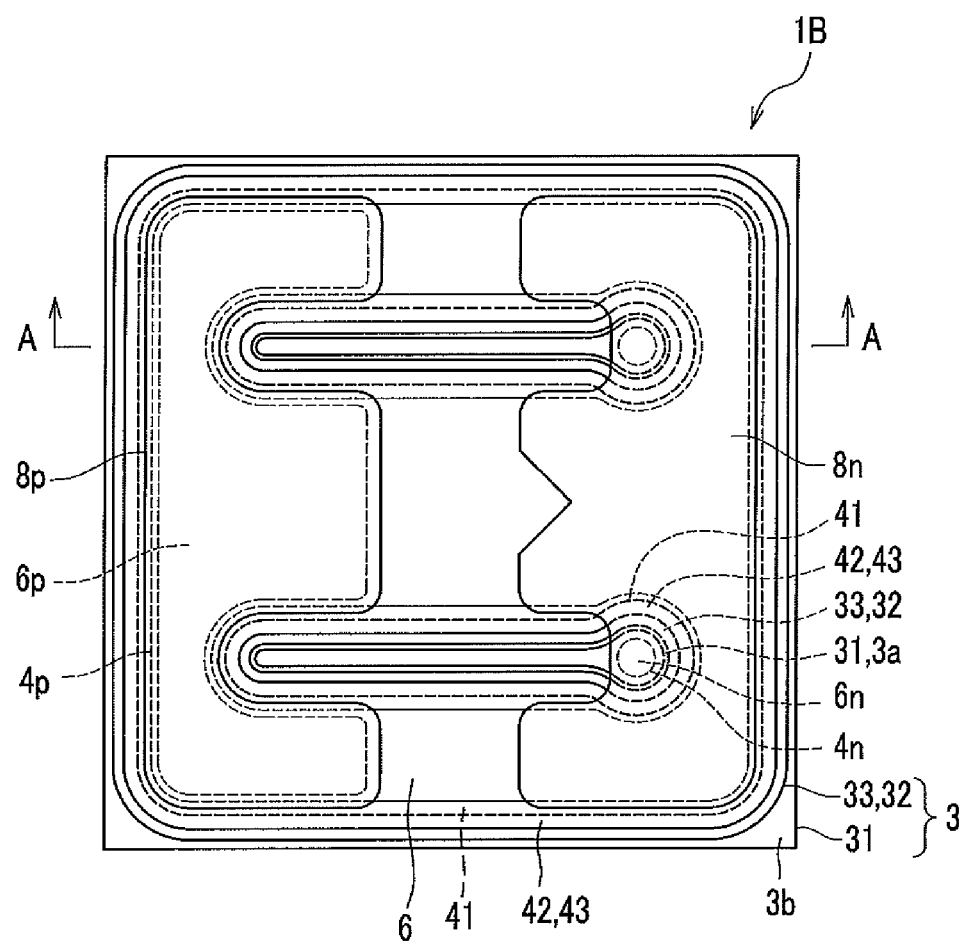
FIG. 11A is a schematic planar view illustrating a structure of a semiconductor light emitting element according to a third embodiment.
Figure 11B:
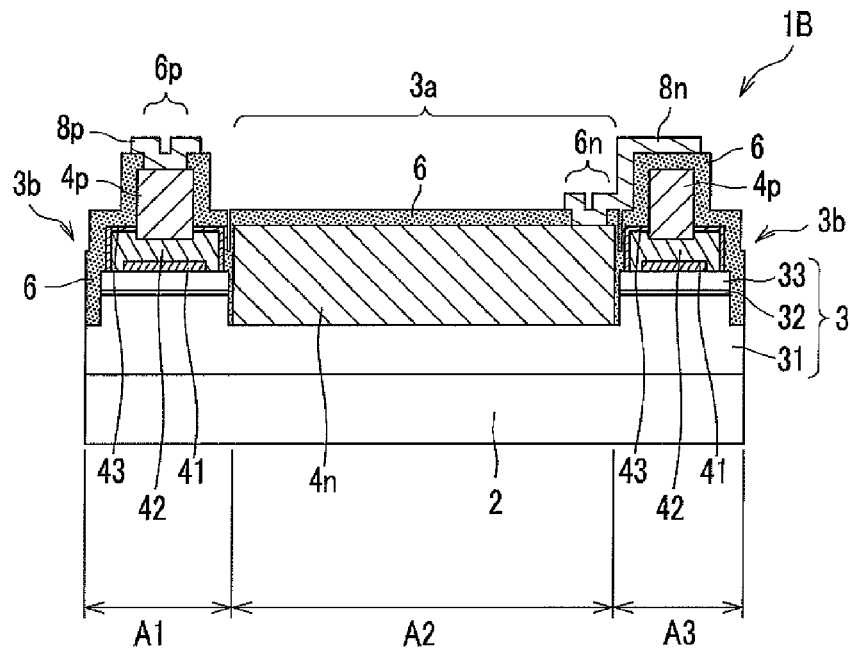
FIG. 11B is a cross-sectional view along A-A line in FIG. 11A.
Figure 11C:
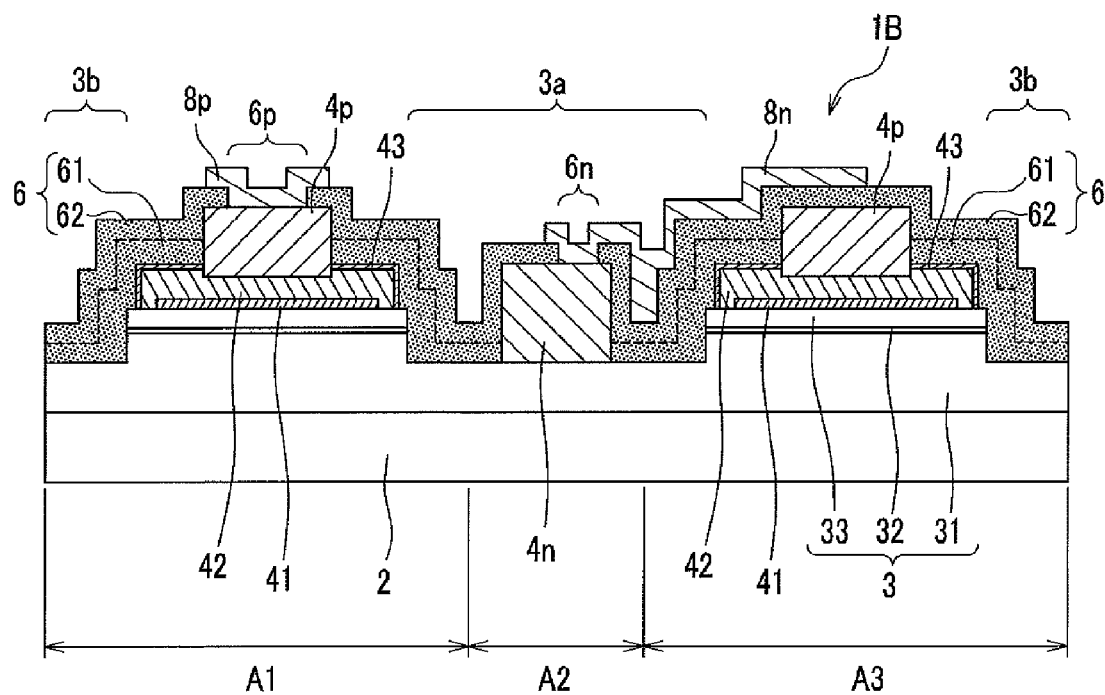
FIG. 11C is a cross-sectional view illustrating the partially scaled cross-section along A-A line in FIG. 11A.

As illustrated in FIGS. 11A to 11C, the semiconductor light emitting element 1B differs from the semiconductor light emitting element 1A according to the second embodiment illustrated in FIGS. 8A to 8C in that an arrangement range of the p-side eutectic pad electrode 8p is limited on the p-type semiconductor layer 33 and does not extend onto the stepped portion 3a. Further, the shape of the n-side eutectic pad electrode 8n differs seen in planar view. Other structures and operations are the same as the semiconductor light emitting element 1A according to the second embodiment, explanations thereof will be omitted.

In FIG. 11A, the insulation film 6 and the metal oxide film 43 are omitted. Further, in a cross-sectional view illustrated in FIG. 11B, each layer of the substrate 2 and the semiconductor laminated body 3 is not illustrated by hatching. FIG. 11C is a cross-sectional view along A-A line in FIG. 11A. FIG. 11C illustrates widths of members and spaces therebetween by scaling as needed to make an internal structure of the semiconductor light emitting element clearer. Areas Al to A3 in FIG. 11C correspond to areas A1 to A3 in FIG. 11B, respectively. Shortly, FIG. 11C illustrates the expanded areas A1 and A3 and the shortened area A2 in a horizontal direction with respect to FIG. 11B.

Further, since the semiconductor light emitting element 1B according to the embodiment can be manufactured by the same manner as the semiconductor light emitting element 1A according to the second embodiment, explanations thereof will be omitted.

The p-side eutectic pad electrode 8p and the n-side eutectic pad electrode 8n can be formed by forming the resist pattern for shaping the metal film based on the shapes of the p-side eutectic pad electrode 8p and the n-side eutectic pad electrode 8n illustrated in FIG. 11A in the above-mentioned fourth, fifth metal film forming process S39 (see FIG. 9).

<Fourth Embodiment>
[Structure of a Semiconductor Light Emitting Element]

Next, a structure of a semiconductor light emitting element according to a fourth embodiment will be explained with reference to FIGS. 12A to 12C. A semiconductor light emitting element 1C according to the fourth embodiment is an LED for flip-chip mounting and has a solid wiring structure as the semiconductor light emitting element 1A according to the second embodiment illustrated in FIGS. 8A to 8C.

Figure 12A:
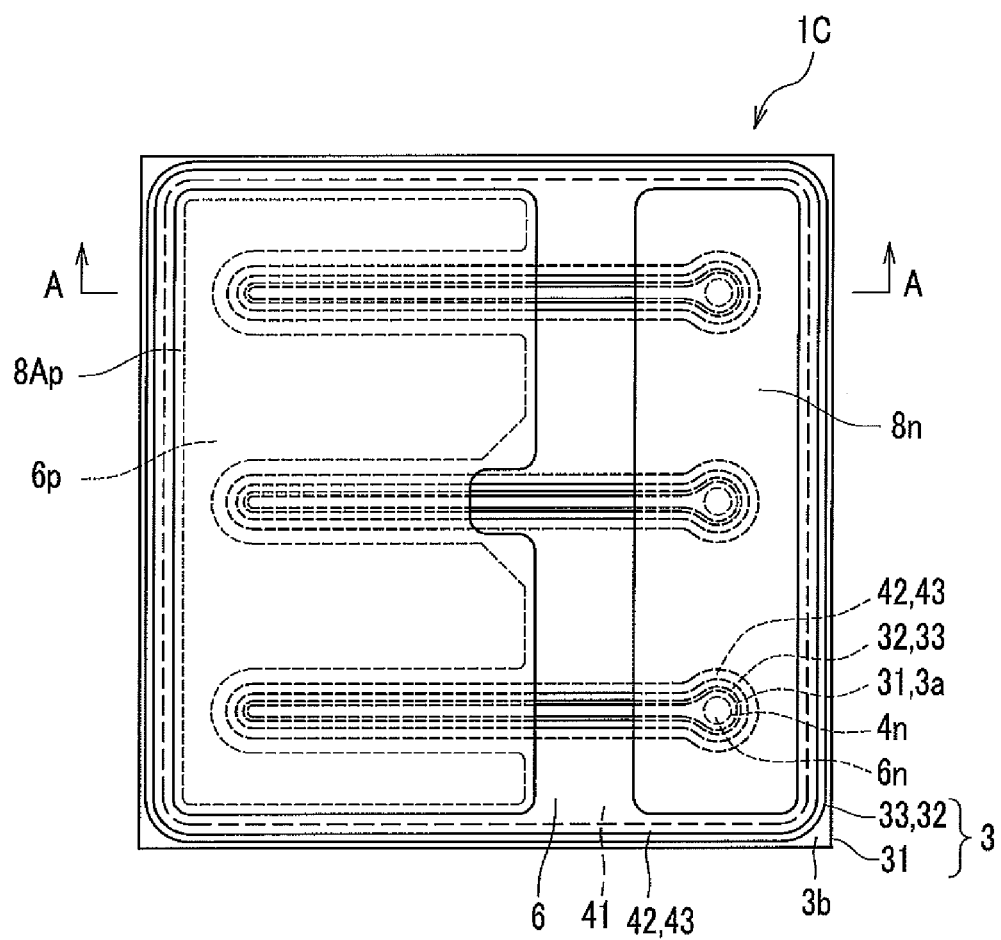
FIG. 12A is a schematic planar view illustrating a structure of a semiconductor light emitting element according to a fourth embodiment.

In FIG. 12A, the insulation film 6 and the metal oxide film 43 are omitted. Further, in a cross-sectional view illustrated in FIG. 12B, each layer of the substrate 2 and the semiconductor laminated body 3 is not illustrated by hatching. FIG. 12C is a cross-sectional view along A-A line in FIG. 12A. FIG. 12C illustrates widths of members and spaces therebetween by scaling as needed to make an internal structure of the semiconductor light emitting element clearer. Areas Al to A3 in FIG. 12C correspond to areas A1 to A3 in FIG. 12B, respectively. Shortly, FIG. 12C illustrates the expanded areas A1 and A3 and the shortened area A2 in a horizontal direction with respect to FIG. 12B.

Figure 12B:
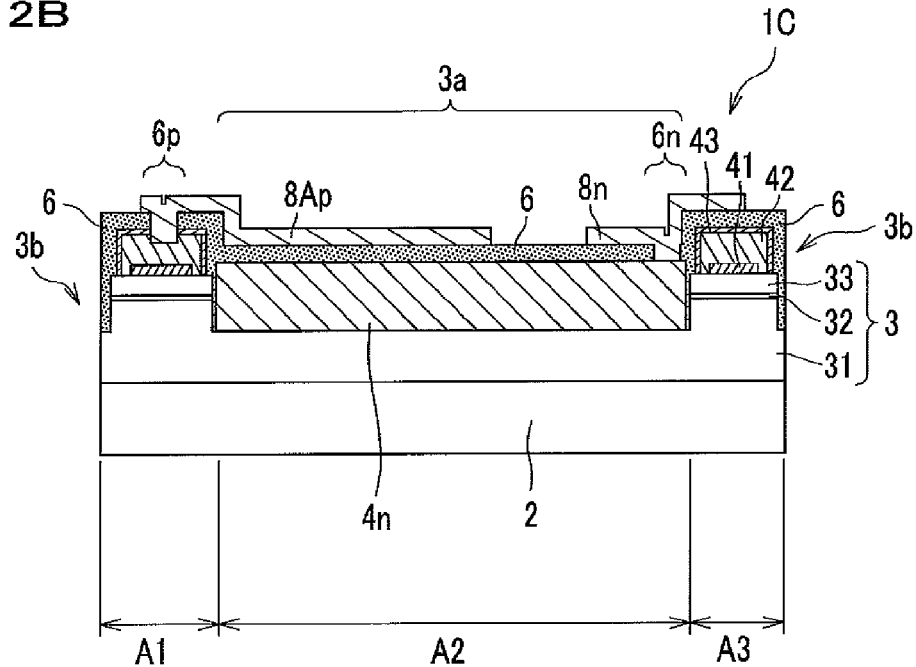
FIG. 12B is a cross-sectional view along A-A line in FIG. 12A.
Figure 12C:
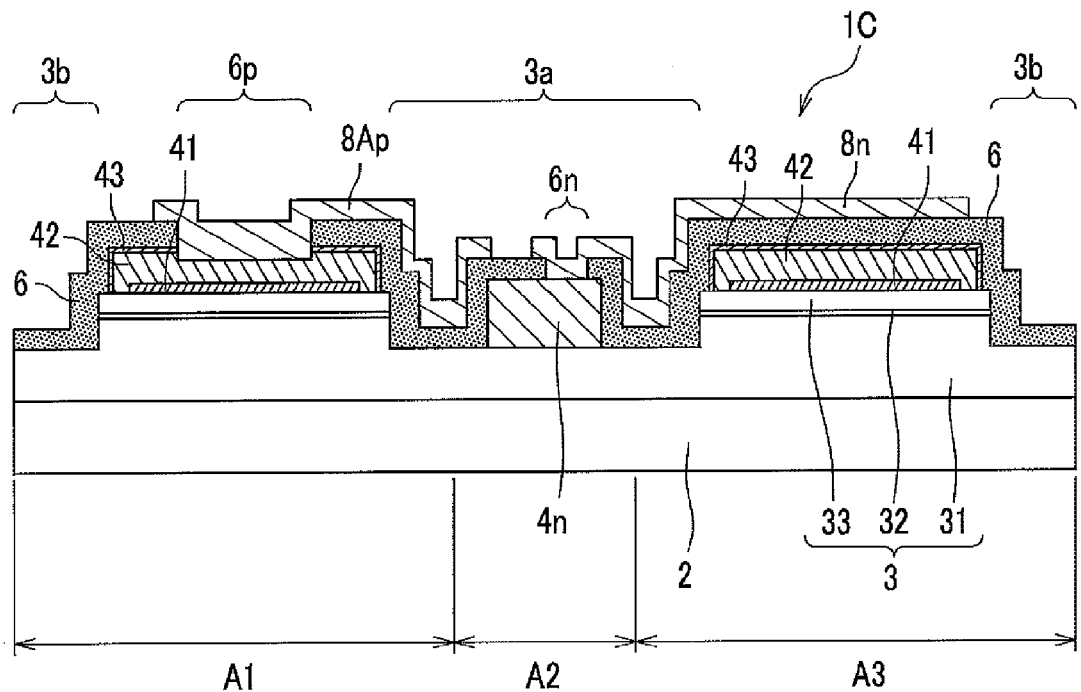
FIG. 12C is a cross-sectional view illustrating the partially scaled cross-section along A-A line in FIG. 12A.

As illustrated in FIGS. 12A to 12C, the semiconductor light emitting element 1C differs from the semiconductor light emitting element 1A according to the second embodiment illustrated in FIGS. 8A to 8C in that the p-side electrode 4p is not provided and a p-side eutectic pad electrode 8Ap (third metal film) is directly connected to the cover electrode 42. Further, the semiconductor light emitting element 1C differs in that the oblong stepped portions 3a seen in planar view are provided at three positions, the n-side electrode 4n is arranged in each stepped portion 3a and the shapes of the p-side eutectic pad electrode 8Ap, and the n-side eutectic pad electrode 8n seen in planar view are different. Still further, the semiconductor light emitting element 1C differs in that the insulation film 6 is formed in a single layer.

In the fourth embodiment, the p-side eutectic pad electrode 8Ap extends onto the insulation film 6 provided on the n-side electrode 4n in the stepped portion 3a as the p-side eutectic pad electrode 8p in the second embodiment.

A multilayer film laminated with Ti/Ni/Au from, for example, a low layer side sequentially can be used for the p-side eutectic pad electrode 8Ap as the p-side eutectic pad electrode 8p in the second embodiment.

Further, in the fourth embodiment, the p-side eutectic pad electrode 8Ap (third metal film) is directly connected to the cover electrode 42 as described above. Therefore, the bottom layer of the p-side eutectic pad electrode 8Ap which is bonded with the cover electrode 42 made of an Al or an Al-based alloy is preferably made of an Al or an Al-based alloy. As such a metal film, a multilayer film can be used, in which an Al—Cu—Si alloy (for example, Cu: 2 mass %, Si: 1 mass %, Al: remainder)/Ti/Ni/Au are laminated from, for example, a low layer side sequentially. Thus, since the bottom layer is formed with an Al-based metal material, an adhesion property between the cover electrode 42 and the p-side eutectic pad electrode 8Ap can be improved.

Since other structures and operations of the semiconductor light emitting element 1C are the same as the semiconductor light emitting element 1A according to the second embodiment, explanations thereof will be omitted.

[Method of Manufacturing the Semiconductor Light Emitting Element]

Next, a method of manufacturing the semiconductor light emitting element 1C according to the fourth embodiment will be explained with reference to FIG. 13.

Figure 13:
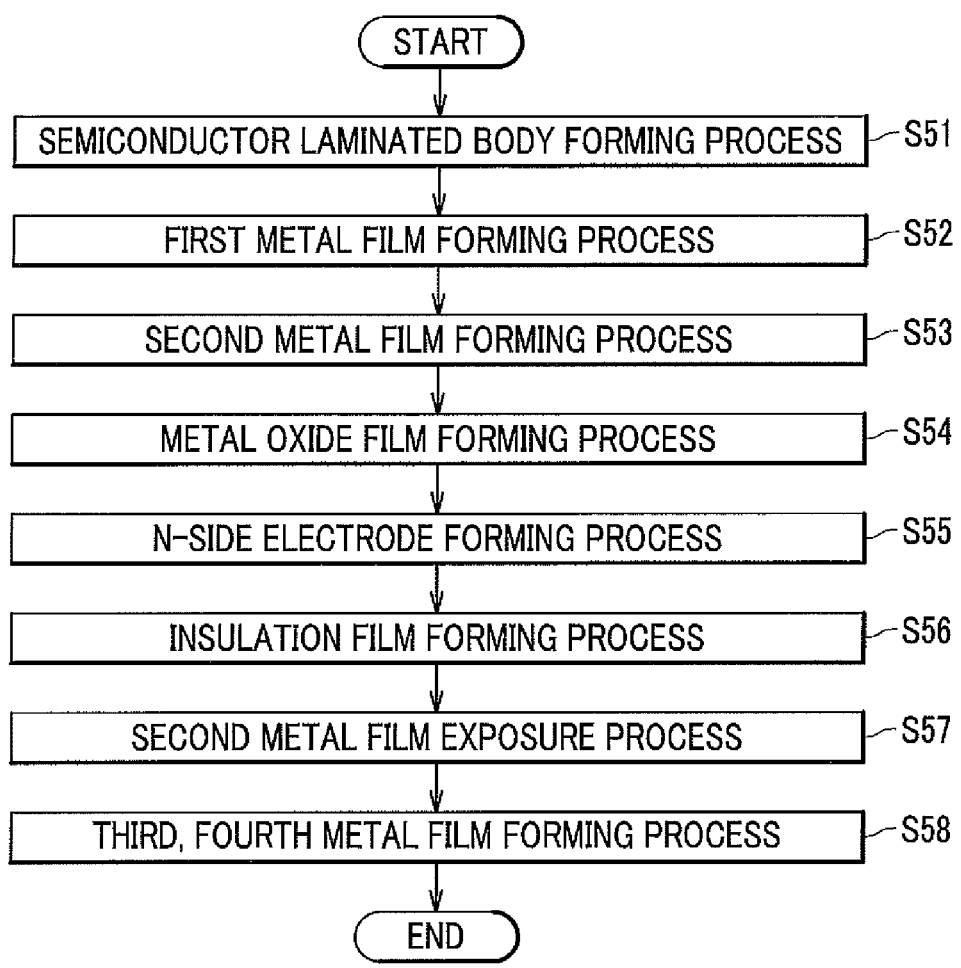
FIG. 13 is a flowchart illustrating a method of manufacturing the semiconductor light emitting element according to the fourth embodiment.

As illustrated in FIG. 13, the method of manufacturing the semiconductor light emitting element 1C according to the fourth embodiment includes a semiconductor laminated body forming process S51, a first metal film forming process S52, a second metal film forming process S53, a metal oxide film forming process S54, an n-side electrode forming process S55, an insulation film forming process S56, a second metal film exposure process S57 and a third, fourth metal film forming process S58.

The semiconductor laminated body forming process S51, the first metal film forming process S52, the second metal film forming process S53 and the metal oxide film forming process S54 are the same as the semiconductor laminated body forming process S11, the first metal film forming process S12, the second metal film forming process S13 and the metal oxide film forming process S14 of the method of manufacturing in the first embodiment illustrated in FIG. 3A, respectively. Therefore, explanations thereof will be omitted.

Following processes will be explained in detail with reference to FIGS. 14A to 15B (see FIGS. 12A to 13 as needed).

In FIGS. 14A to 15B, the substrate 2 is omitted. Each layer of the semiconductor laminated body 3 is not illustrated by hatching.

Figure 14A:
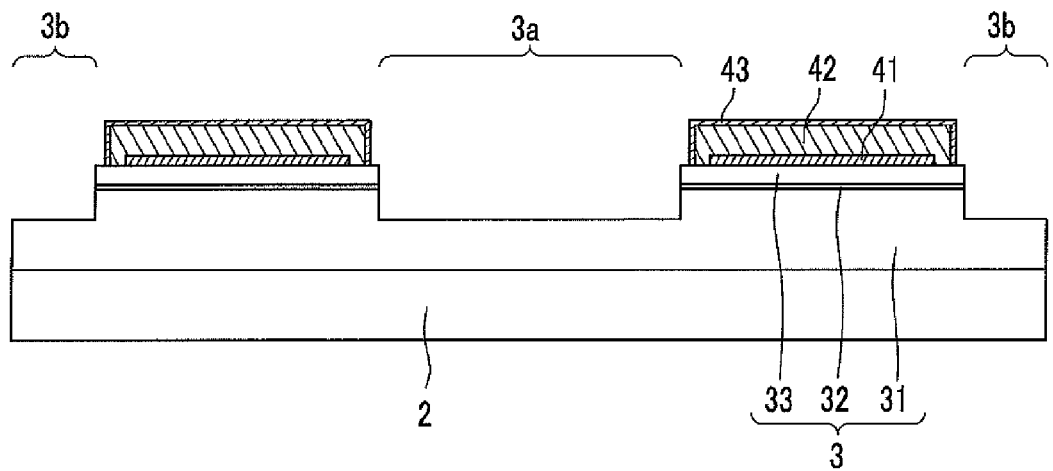
FIG. 14A is a schematic cross-sectional view of a formed cover electrode and a metal oxide film.

FIG. 14A illustrates a state after the semiconductor laminated body forming process S51, the first metal film forming process S52, the second metal film forming process S53 and the metal oxide film forming process S54 are performed sequentially.

(N-Side Electrode Forming Process)

Figure 14B:
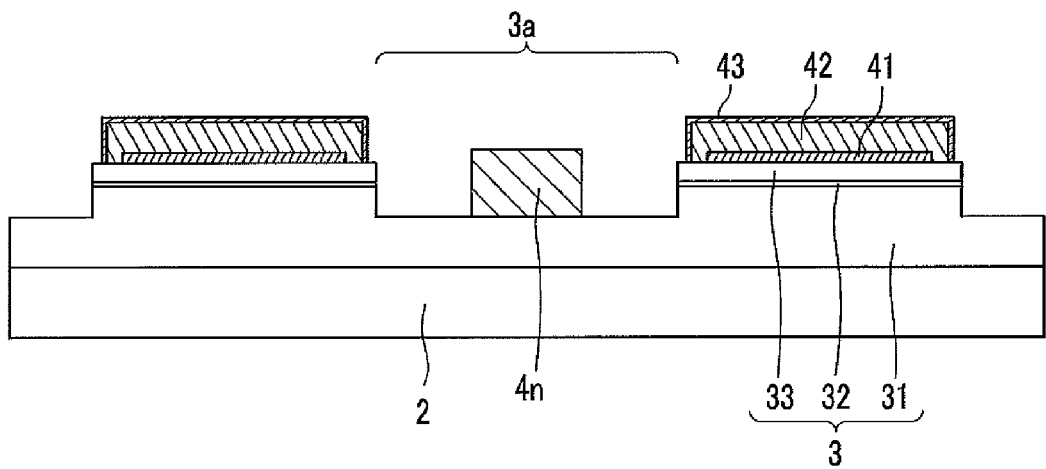
FIG. 14B is a schematic cross-sectional view of a formed n-side electrode.

In the n-side electrode forming process S55, as illustrated in FIG. 14B, the n-side electrode 4n is formed in the stepped portion 3a. The n-side electrode 4n can be formed by the photolithography method or the lift-off method. The metal film to become the n-side electrode 4n in the fourth embodiment can be formed with the same material as the n-side electrode 4n in other embodiments mentioned above by the sputtering method.

(Insulation Film Forming Process)

Figure 14C:
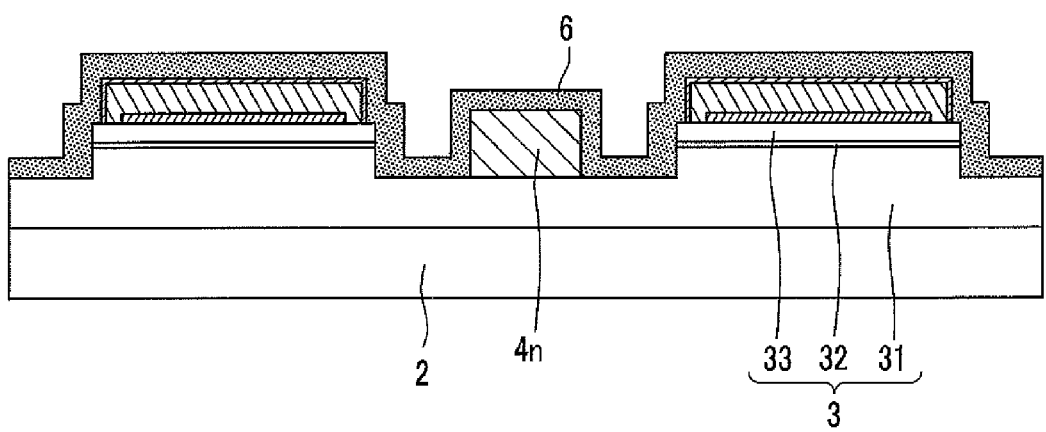
FIG. 14C is a schematic cross-sectional view of a formed insulation film.

In the insulation film forming process S56, as illustrated in FIG. 14C, the insulation film 6 is formed over the wafer. The insulation film 6 can be formed with an insulation material made of an oxide such as $SiO_2$ in the same manner as the insulation film forming process S15 in the first embodiment.

(Second Metal Film Exposure Process)

Figure 15A:
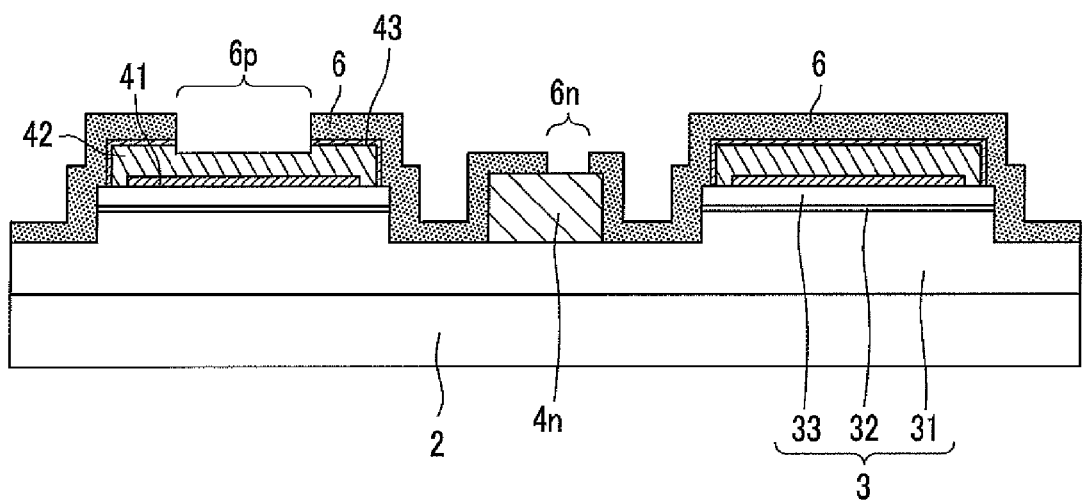
FIG. 15A is a schematic cross-sectional view of an exposed cover electrode and an exposed n-side electrode.

In the second insulation film forming process S57, as illustrated in FIG. 15A, the openings 6p, 6n are formed in the insulation film 6 by etching. Shortly, a region of the cover electrode (second metal film) 42 on which the p-side eutectic pad electrode 8Ap is connected and a region of the n-side electrode 4n on which the n-side eutectic pad electrode 8n is connected are exposed.

The process can be performed in the same manner as the second metal film exposure process S16 (see FIG. 3) in the first embodiment. Shortly, a resist pattern is formed, which has the openings at regions where the cover electrode 42 and the n-side electrode 4n need to be exposed. The metal oxide film 43 is removed with the insulation film 6 in the openings by etching with the resist pattern as mask. The concave portion 42a (see FIG. 2) is formed by removing a portion of the cover electrode 42 in the thickness direction by further etching. At this time, the etching is preferably performed such that the base surface of the concave portion 42a (see FIG. 2) is roughened. Thus, the adhesion property between the cover electrode 42 and the p-side eutectic pad electrode 8Ap enhances.

(Third, Fourth Metal Film Forming Process)

Figure 15B:
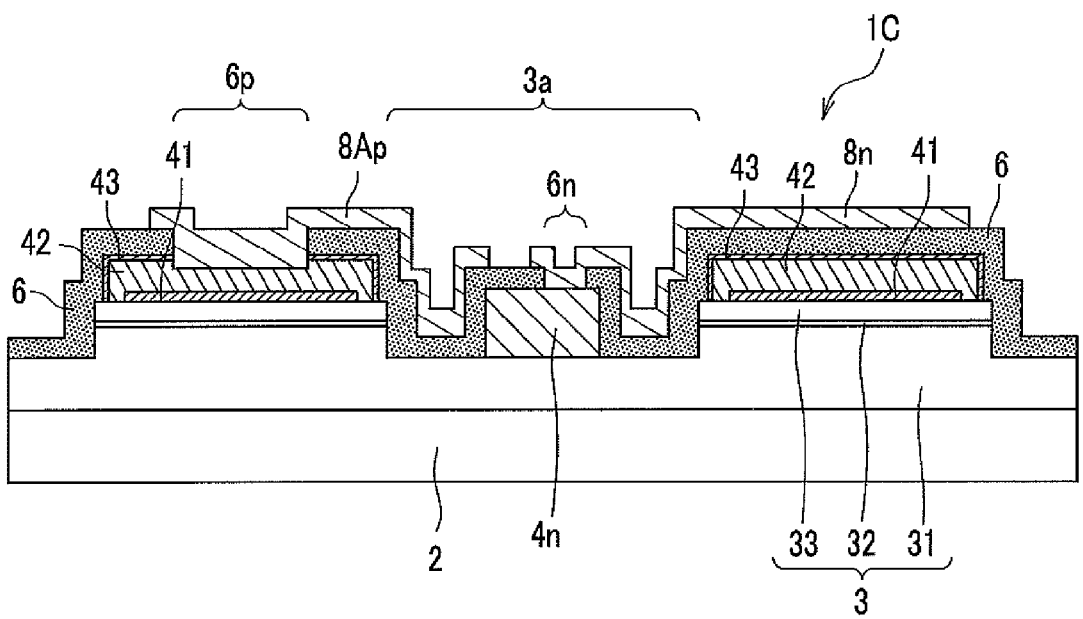
FIG. 15B is a schematic cross-sectional view of formed eutectic pad electrodes.

In the third, fourth metal film forming process S58, as illustrated in FIG. 15B, the p-side eutectic pad electrode (third metal film) 8Ap and the n-side eutectic pad electrode (fourth metal film) 8n are formed. In the fourth embodiment, the p-side eutectic pad electrode 8Ap is provided to be electrically connected to the cover electrode 42 illustrated at a left side in FIG. 15B in the opening 6p of the insulation film 6 and to extend onto the insulation film 6 which covers the upper surface of the n-side electrode 4n in the stepped portion 3a. Further, the n-side eutectic pad electrode 8n is provided to be electrically connected to the n-side electrode 4n in the stepped portion 3a through the opening 6n of the insulation film 6 and to extend onto the insulation film 6 which covers the upper surface of the cover electrode 42 illustrated at a right side in FIG. 15B via the metal oxide film 43.

Since the third, fourth metal film forming process S58 can be performed in the same manner as the fourth, fifth metal film forming process S39 (see FIG. 9) in the second embodiment, an explanation thereof will be omitted.

Further, since the semiconductor light emitting element 1C according to the fourth embodiment does not have the p-side electrode 4p (see FIG. 8B) and the insulation film 6 is formed in a single layer, the number of manufacturing processes can be decreased as compared with the semiconductor light emitting element 1A according to the second embodiment.

Fifth Embodiment

A structure of a semiconductor light emitting element according to a fifth embodiment will be explained with reference to FIGS. 16A to 16C. A semiconductor light emitting element 1D according to the fifth embodiment is an LED for flip-chip mounting and has a solid wiring structure as the semiconductor light emitting element 1C according to the fourth embodiment illustrated in FIGS. 12A to 12C.

Figure 16A:
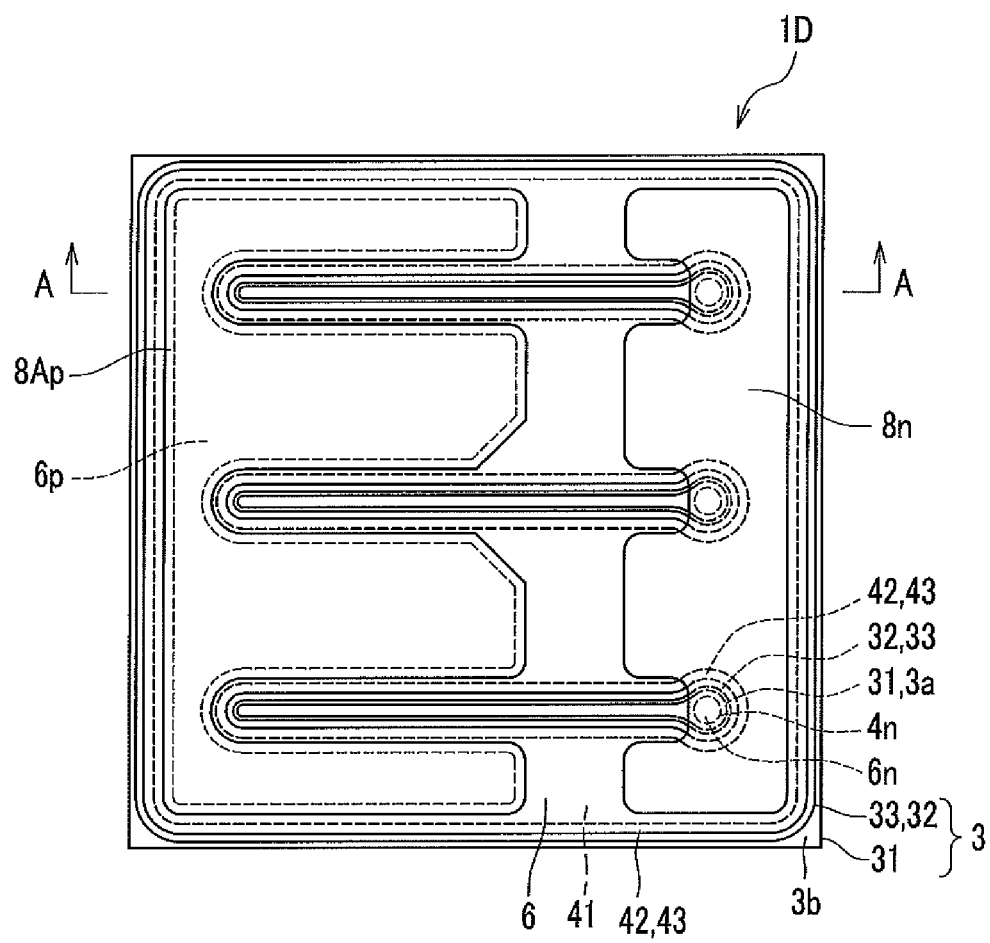
FIG. 16A is a schematic planar view illustrating a structure of a semiconductor light emitting element according to a fifth embodiment.
Figure 16B:
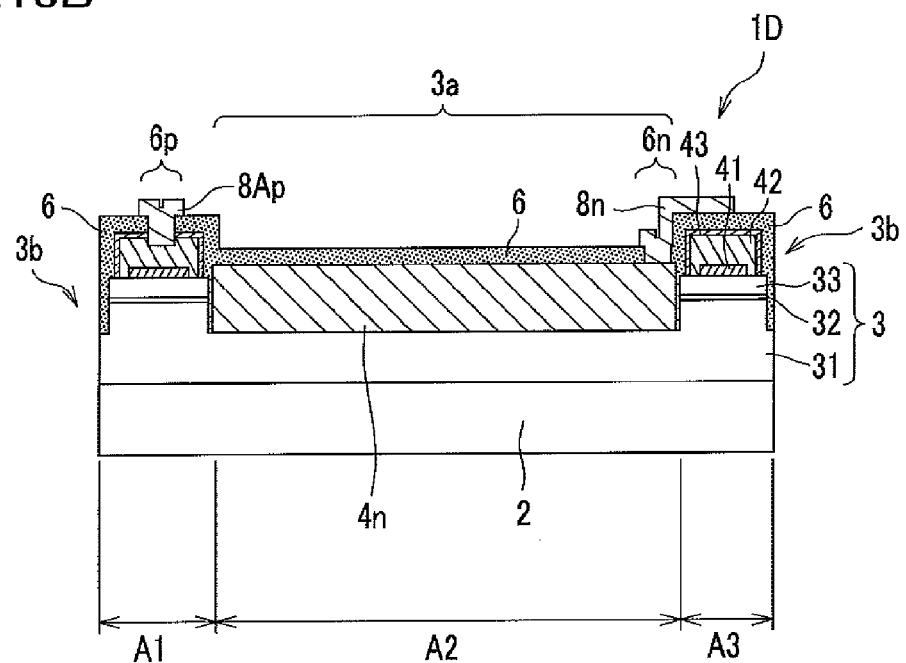
FIG. 16B is a cross-sectional view along A-A line in FIG. 16A.
Figure 16C:
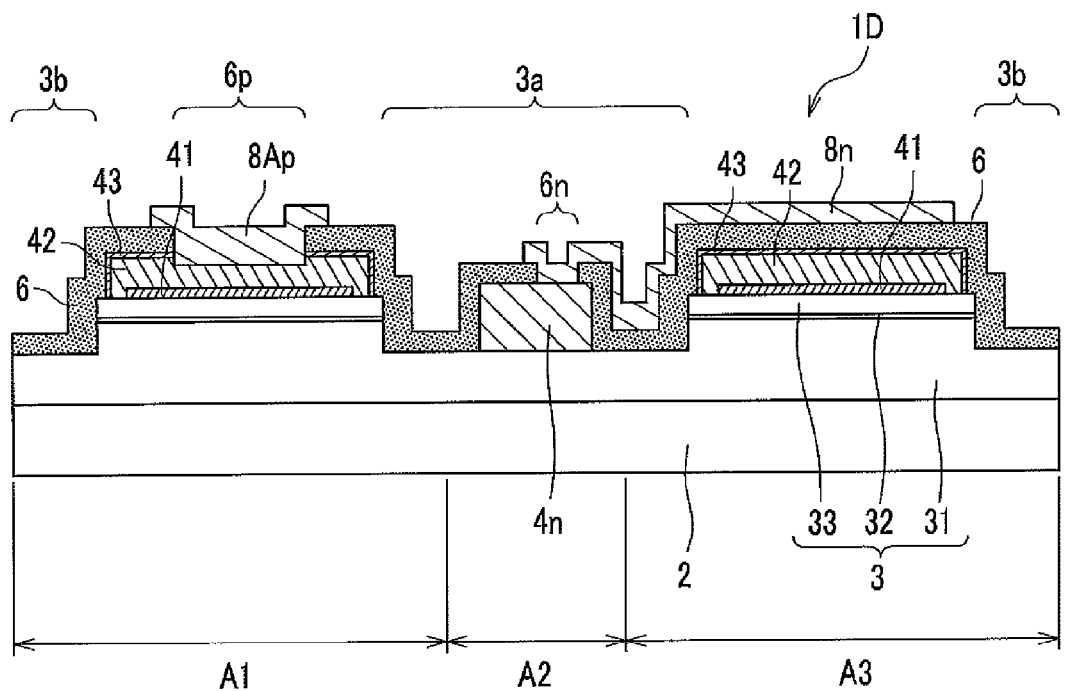
FIG. 16C is a cross-sectional view illustrating the partially scaled cross-section along A-A line in FIG. 16A.

As illustrated in FIGS. 16A to 16C, the semiconductor light emitting element 1D differs from the semiconductor light emitting element 1C according to the fourth embodiment illustrated in FIGS. 12A to 12C in that an arrangement range of the p-side eutectic pad electrode 8Ap is limited on the p-type semiconductor layer 33 and does not extend within the stepped portion 3a. Further, the shape of the n-side eutectic pad electrode 8n differs seen in planar view. Since other structures and operations are the same as the semiconductor light emitting element 1C according to the fourth embodiment, explanations thereof will be omitted.

In FIG. 16A, the insulation film 6 and the metal oxide film 43 are omitted. Further, in a cross-sectional view illustrated in FIG. 16B, each layer of the substrate 2 and the semiconductor laminated body 3 is not illustrated by hatching. FIG. 16C is a cross-sectional view along A-A line in FIG. 16A. FIG. 16C illustrates widths of members and spaces therebetween by scaling as needed to make an internal structure of the semiconductor light emitting element clearer. Areas A1 to A3 in FIG. 16C correspond to areas A1 to A3 in FIG. 16B, respectively. Shortly, FIG. 16C illustrates the expanded areas A1 and A3 and the shortened area A2 in a horizontal direction with respect to FIG. 16B.

Further, since the semiconductor light emitting element 1D according to the fifth embodiment can be manufactured by the same manner as the semiconductor light emitting element 1C according to the fourth embodiment, an explanation thereof will be omitted.

The p-side eutectic pad electrode 8Ap and the n-side eutectic pad electrode 8n in the embodiment can be formed by forming a resist pattern for shaping a metal film based on shapes of the p-side eutectic pad electrode 8Ap and the n-side eutectic pad electrode 8n illustrated in FIG. 16A in the above-mentioned third, fourth metal film forming process S58 (see FIG. 13).

According to the semiconductor light emitting elements of the embodiments, the second metal film which prevents Ag migration contained in the first metal film as reflection film is covered by the metal oxide film containing an oxide of a metal material forming the second metal film and the insulator made of an oxide. This prevents deterioration of the second metal film, and as a result, prevention effect to migration due to the second metal film cannot be lowered. Further, since an Al or an Al-based metal material is used as the second metal film, reflectance on a contact surface between the second metal film and the semiconductor layer enhances, light extraction efficiency of the semiconductor light emitting element is improved.

Further, according to the methods of manufacturing a semiconductor light emitting element of the embodiments, a semiconductor light emitting element having the effects described above can be manufactured.

EXAMPLE

A measurement result of light extraction efficiency from the semiconductor light emitting element to the outside will be explained. The measurement is based on samples of the semiconductor light emitting element formed with Al alloy and a semiconductor light emitting element formed with a metal having lower reflectance than Al as comparative example.

[Manufacturing Condition]

Each sample of the semiconductor light emitting elements is formed with a gallium nitride semiconductor material and an emission wavelength is 450 nm (blue light).

A shape of each sample is set under condition that the arrangement number of the stepped portion 3a and the n-side electrode 4n is 4×4=16 positions instead of 3×3=9 positions in the semiconductor light emitting element 1 illustrated in FIG. 1A.

Further, in each sample, when a contact area between the p-type semiconductor layer and the full surface electrode made of an Ag is set as 100%, a contact area between the p-type semiconductor layer and the cover electrode is 5.0%.

Still further, a metal material for the cover electrode in each sample is as follows:

Example 1

A single layer film of an Al—Cu alloy (Cu: 2 mass %, Al: remainder and thickness: 2000 nm).

Example 2

A multilayer film laminated with an Al—Cu alloy (Cu: 2 mass %, Al: remainder and thickness: 2000 nm)/Ru (thickness: 100 nm)/Ti (thickness: 3 nm) from a low layer side sequentially.

Comparative Example

A multilayer film laminated with a Ti (thickness: 2 nm)/Au (thickness: 170 nm)/W (thickness: 120 nm)/Ti (thickness: 3 nm) from a low layer side sequentially.

[Measurement Result of Efficiency]

| | |
|---|---|
| (Example 1) | 154.5 [lm/W] |
| (Example 2) | 155.5 [lm/W] |
| (Comparative example) | 148.5 [lm/W] |

It is recognized that the examples 1 and 2 in which the Al alloy is used as the cover electrode can improve 4% to 5% of efficiency compared with the comparative example.

The semiconductor light emitting elements and the methods of manufacturing the semiconductor light emitting elements according to the embodiments are specifically explained above in detailed description of the preferred embodiments, but an object of the invention is not limited to the descriptions and must be interpreted broadly based on claims. Further, various changes and alterations based on the descriptions should be included in the object of the invention.

What is claimed is:

1. A semiconductor light emitting element comprising:
    a semiconductor laminated body in which an n-type semiconductor layer and a p-type semiconductor layer are laminated;
    a first metal film that is provided on an upper surface of the p-type semiconductor layer and of which a surface contacting on the p-type semiconductor layer is made of an Ag or an Ag-based alloy;
    a second metal film that covers a surface of the first metal film, is provided to contact on the upper surface of the p-type semiconductor layer at an outer edge of the first metal film, has a concave part on an upper surface of the second metal film, and is made of an Al or an Al-based alloy, wherein the concave part has a bottom surface and lateral surfaces;
    a third metal film that is provided in the concave part formed in the second metal film, and is in contact with the bottom surface of the concave part in the second metal film;
    a metal oxide film that covers other portions of the second metal film and contains at least an oxide of a metal material forming the second metal film; and
    an insulation film that covers a surface of the metal oxide film and is made of an oxide.

2. The semiconductor light emitting element according to claim 1, wherein the metal oxide film contacts on the third metal film.

3. The semiconductor light emitting element according to claim 1, wherein a connection portion between the second metal film and the third metal film is roughened.

4. The semiconductor light emitting element according to claim 1, wherein a surface of the third metal film contacting on the second film is made of an Al or Al-based alloy.

5. The semiconductor light emitting element according to claim 1, wherein the semiconductor laminated body has a stepped portion in which all the p-type semiconductor layer and a portion of the n-type semiconductor layer are removed in a laminated direction on a portion of the upper surface of the p-type semiconductor layer, and an n-side electrode that is electrically connected to the n-type semiconductor layer is provided on the stepped portion.

6. The semiconductor light emitting element according to claim 5 further comprising:
    a fourth metal film that is electrically connected to the n-side electrode through an opening and extends on the insulation film provided on the second metal film; and
    a fifth metal film that is electrically connected to the third metal film and extends on the insulation film,
    wherein the insulation film covers the third metal film, the n-side electrode and the semiconductor laminated body, and has the opening that opens in a portion of an upper surface of the n-side electrode.

7. The semiconductor light emitting element according to claim 5 further comprising:
    a fourth metal film that is electrically connected to the n-side electrode through an opening and extends on the insulation film provided on the second metal film,
    wherein the insulation film covers the n-side electrode and the semiconductor laminated body and has the opening that opens in a portion of the upper surface of the n-side electrode, and the third metal film extends on the insulation film.

8. A method of manufacturing a semiconductor light emitting element comprising successive steps of:
    forming a semiconductor laminated body by laminating an n-type semiconductor layer and a p-type semiconductor layer;
    forming a first metal film on an upper surface of the p-type semiconductor layer such that a surface contacting on the p-type semiconductor layer is made of an Ag or an Ag-based alloy;
    forming a second metal film that covers a surface of the first metal film, is provided to contact on the upper surface of the p-type semiconductor layer at an outer edge of the first metal film, has a concave part on an upper surface of the second metal film, and is made of an Al or an Al alloy;
    forming a metal oxide film that covers a surface of the second metal film and contains at least an oxide of a metal material forming the second metal film;
    forming an insulation film that covers a surface of the metal oxide film with an insulation material made of an oxide;
    exposing a portion of the surface of the second metal film by etching; and
    forming a third metal film in the concave part formed in the second metal film, the third metal film being in contact with a bottom surface of the concave part in the second metal film.

9. The method of manufacturing a semiconductor light emitting element according to claim 8, wherein the exposing the second metal film comprising steps of:
    forming a resist pattern that has a resist opening in a region of the insulation film provided on an upper surface of the second metal film; and etching the insulation film in the resist opening having the resist pattern as mask, and etching to expose a portion of the second metal film positioned in a lower layer in a thickness direction.

10. The method of manufacturing a semiconductor light emitting element according to claim 9, wherein the etching the insulation film further etching an exposed surface of the second metal to be roughened.

11. A semiconductor light emitting element, comprising:
   laminated semiconductor means for supporting element components thereupon;
   first metal film means provided on an upper surface of the laminated semiconductor means, the first metal film means for contacting the laminated semiconductor means;
   second metal film means for covering a surface of the first metal film means, the second metal film means for contacting the upper surface of the laminated semiconductor means at an outer edge of the first metal film means, and having a concave part on an upper surface of the second metal film means;
   third metal film means provided in the concave part formed in the second metal film means, and being in contact with a bottom surface of the concave part in the second metal film means;
   metal oxide film means for covering other portions of the second metal film means, the metal oxide film means containing at least an oxide of a metal material forming the second metal film means; and
   insulation film means for covering a surface of the metal oxide film means, the insulation film means comprising an oxide.

12. The semiconductor light emitting element according to claim 11, wherein:
   the laminated semiconductor means comprises an n-type semiconductor layer and a p-type semiconductor layer, wherein the first metal film means comprises an Ag or an Ag-based alloy, and wherein the second metal film means comprises an Al or an Al-based alloy.

13. The semiconductor light emitting element according to claim 11, wherein the metal oxide film means is for contacting the third metal film means.

14. The semiconductor light emitting element according to claim 11, wherein a connection portion between the second metal film means and the third metal film means is roughened.

15. The semiconductor light emitting element according to claim 12, wherein a surface of the third metal film means contacting the second metal film means comprises an Al or Al-based alloy.

16. The semiconductor light emitting element according to claim 12, wherein the laminated semiconductor means comprises a stepped portion wherein all of the p-type semiconductor layer and at least a portion of the n-type semiconductor layer are removed in a laminated direction on a portion of the upper surface of the p-type semiconductor layer, and wherein an n-side electrode that is electrically connected to the n-type semiconductor layer is provided on the stepped portion.

17. The semiconductor light emitting element according to claim 16, further comprising:
   a fourth metal film means for being electrically connected to the n-side electrode through an opening and extending on the insulation film means provided on the second metal film means; and
   a fifth metal film means for being electrically connected to the third metal film means and extending on the insulation film means,
   wherein the insulation film means is also for covering the third metal film means, the n-side electrode and the laminated semiconductor means, and wherein the insulation film means has the opening that opens in a portion of an upper surface of the n-side electrode.

18. The semiconductor light emitting element according to claim 16, further comprising:
   fourth metal film means for being electrically connected to the n-side electrode through an opening and extending on the insulation film means provided on the second metal film means,
   wherein the insulation film means is also for covering the n-side electrode and the laminated semiconductor means, and has the opening that opens in a portion of the upper surface of the n-side electrode, and wherein the third metal film means extends on the insulation film means.

19. The semiconductor light emitting element according to claim 1, wherein a portion of the metal oxide film is present in part of a connection portion between the second metal film and the third metal film.

20. The semiconductor light emitting element according to claim 3, wherein a portion of the metal oxide film is present in part of the connection portion between the second metal film and the third metal film.

* * * * *